US011917823B2

(12) United States Patent
Geng et al.

(10) Patent No.: US 11,917,823 B2
(45) Date of Patent: Feb. 27, 2024

(54) CHANNEL STRUCTURES HAVING PROTRUDING PORTIONS IN THREE-DIMENSIONAL MEMORY DEVICE AND METHOD FOR FORMING THE SAME

(71) Applicant: YANGTZE MEMORY TECHNOLOGIES CO., LTD., Wuhan (CN)

(72) Inventors: Wanbo Geng, Wuhan (CN); Lei Xue, Wuhan (CN); Xiaoxin Liu, Wuhan (CN); Tingting Gao, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 623 days.

(21) Appl. No.: 17/117,744

(22) Filed: Dec. 10, 2020

(65) Prior Publication Data

US 2022/0149070 A1    May 12, 2022

Related U.S. Application Data

(63) Continuation of application No. PCT/CN2020/127822, filed on Nov. 10, 2020.

(51) Int. Cl.
*H10B 43/27* (2023.01)
*H10B 43/35* (2023.01)

(52) U.S. Cl.
CPC ............. *H10B 43/27* (2023.02); *H10B 43/35* (2023.02)

(58) Field of Classification Search
CPC .................................. H10B 43/27; H10B 43/35
See application file for complete search history.

(56) References Cited

U.S. PATENT DOCUMENTS 8,815,676 B2    8/2014    Yang et al.
8,946,807 B2    2/2015    Hopkins et al.
(Continued)

FOREIGN PATENT DOCUMENTS

CN    105027285 A    11/2015
CN    111263980 A    6/2020
(Continued)

OTHER PUBLICATIONS

International Search Report issued in corresponding International Application No. PCT/CN2020/127821, dated Jun. 28, 2021, 4 pages.
(Continued)

*Primary Examiner* — Nathan W Ha
(74) *Attorney, Agent, or Firm* — BAYES PLLC

(57) ABSTRACT

A first opening extending vertically through a dielectric stack is formed above a substrate. The dielectric stack includes vertically interleaved dielectric layers and sacrificial layers. Parts of the sacrificial layers facing the opening are removed to form a plurality of first recesses. A plurality of stop structures are formed along sidewalls of the plurality of first recesses. A plurality of storage structures are formed over the plurality of stop structures in the plurality of first recesses. The plurality of sacrificial layers are removed to expose the plurality of stop structures from a plurality of second recesses opposing the plurality of first recesses. The plurality of stop structures are removed to expose the plurality of storage structures. A plurality of blocking structures are formed over the plurality of storage structures in the plurality of second recesses.

20 Claims, 17 Drawing Sheets

(56) References Cited

U.S. PATENT DOCUMENTS

| | | | |
|---|---|---|---|
| 9,099,496 B2* | 8/2015 | Tian | H10B 41/27 |
| 9,230,974 B1* | 1/2016 | Pachamuthu | H10B 43/35 |
| 9,230,976 B2* | 1/2016 | Alsmeier | H10B 41/10 |
| 9,236,396 B1 | 1/2016 | Koka et al. | |
| 9,305,849 B1* | 4/2016 | Tsutsumi | H01L 29/40117 |
| 9,576,975 B2 | 2/2017 | Zhang et al. | |
| 9,659,955 B1* | 5/2017 | Sharangpani | H01L 21/02356 |
| 9,659,956 B1* | 5/2017 | Pachamuthu | H10B 43/27 |
| 9,875,929 B1* | 1/2018 | Shukla | H01L 29/40117 |
| 10,283,513 B1* | 5/2019 | Zhou | H10B 43/50 |
| 10,700,087 B2* | 6/2020 | Han | H10B 43/35 |
| 10,700,090 B1 | 6/2020 | Cui et al. | |
| 11,081,496 B2* | 8/2021 | Xiao | H01L 29/40117 |
| 11,302,708 B2* | 4/2022 | Kim | H01L 29/4991 |
| 11,515,321 B2* | 11/2022 | Kim | H01L 29/66833 |
| 11,569,257 B2* | 1/2023 | Han | H10B 43/27 |
| 2007/0054448 A1 | 3/2007 | Choi et al. | |
| 2012/0083077 A1 | 4/2012 | Yang et al. | |
| 2013/0270624 A1 | 10/2013 | Yun et al. | |
| 2014/0203344 A1 | 7/2014 | Hopkins et al. | |
| 2015/0380424 A1 | 12/2015 | Makala et al. | |
| 2016/0043093 A1* | 2/2016 | Lee | H01L 29/1033 257/314 |
| 2016/0071860 A1* | 3/2016 | Kai | H10B 43/10 257/321 |
| 2016/0086972 A1* | 3/2016 | Zhang | H10B 43/35 438/269 |
| 2016/0163728 A1* | 6/2016 | Tsutsumi | H10B 41/27 257/66 |
| 2016/0172366 A1 | 6/2016 | Koka et al. | |
| 2016/0181271 A1* | 6/2016 | Yada | H10B 43/27 438/264 |
| 2017/0125436 A1* | 5/2017 | Sharangpani | H01L 21/0228 |
| 2018/0090373 A1 | 3/2018 | Sharaqngpani et al. | |
| 2018/0151588 A1* | 5/2018 | Tsutsumi | H01L 21/0228 |
| 2018/0374863 A1 | 12/2018 | Purayath | |
| 2019/0252405 A1 | 8/2019 | Tsutsumi | |
| 2021/0057434 A1* | 2/2021 | Surthi | H01L 29/4991 |
| 2021/0057446 A1* | 2/2021 | Sawabe | H10B 43/27 |
| 2021/0091106 A1* | 3/2021 | Wang | H01L 29/40117 |
| 2021/0098479 A1* | 4/2021 | Son | G11C 5/06 |
| 2021/0098485 A1* | 4/2021 | Bin | H10B 43/27 |

FOREIGN PATENT DOCUMENTS

| | | |
|---|---|---|
| CN | 111758164 A | 10/2020 |
| JP | 2010087272 A | 4/2010 |
| TW | 202021094 A | 6/2020 |

OTHER PUBLICATIONS

International Search Report issued in corresponding International Application No. PCT/CN2020/127822, dated Aug. 10, 2021, 5 pages.

* cited by examiner

CHANNEL STRUCTURES HAVING PROTRUDING PORTIONS IN THREE-DIMENSIONAL MEMORY DEVICE AND METHOD FOR FORMING THE SAME

CROSS-REFERENCE TO RELATED APPLICATIONS

This application is continuation of International Application No. PCT/CN2020/127822, filed on Nov. 10, 2020, entitled "CHANNEL STRUCTURES HAVING PROTRUDING PORTIONS IN THREE-DIMENSIONAL MEMORY DEVICE AND METHOD FOR FORMING THE SAME," which is hereby incorporated by reference in its entirety. This application is also related to co-pending U.S. application Ser. No. 17/117,728, filed on Dec. 10, 2020, entitled "CHANNEL STRUCTURES HAVING PROTRUDING PORTIONS IN THREE-DIMENSIONAL MEMORY DEVICE AND METHOD FOR FORMING THE SAME," which is hereby incorporated by reference in its entirety.

BACKGROUND

The present disclosure relates to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and methods for forming the same are disclosed herein.

In one example, a method for forming a 3D memory device is disclosed. A first opening extending vertically through a dielectric stack is formed above a substrate. The dielectric stack includes dielectric layers and sacrificial layers interleaving the dielectric layers. Parts of the sacrificial layers facing the opening are removed to form a plurality of first recesses. A plurality of stop structures are formed along sidewalls of the plurality of first recesses. A plurality of storage structures are formed over the plurality of stop structures in the plurality of first recesses. The plurality of sacrificial layers are removed to expose the plurality of stop structures from a plurality of second recesses opposing the plurality of first recesses. The plurality of stop structures are removed to expose the plurality of storage structures. A plurality of blocking structures are formed over the plurality of storage structures in the plurality of second recesses.

In another example, a method for forming a 3D memory device is disclosed. A first opening extending vertically through a dielectric stack is formed above a substrate. The dielectric stack includes dielectric layers and sacrificial layers interleaving the dielectric layers. Parts of the sacrificial layers facing the opening are removed to form a plurality of first recesses. A plurality of first blocking structures are formed along sidewalls and top and bottom surfaces of the plurality of first recesses. A plurality of storage structures are formed over the plurality of first blocking structures in the plurality of first recesses. The plurality of sacrificial layers are removed to form a plurality of second recesses and expose the plurality of first blocking structures. A plurality of second blocking structures are formed along sidewalls and top and bottom surfaces of the plurality of second recesses, such that a thickness of each of the plurality of second blocking structures is nominally the same as a thickness of each of the plurality of first blocking structures.

In still another example, a 3D memory device includes a memory stack including conductive layers and dielectric layers interleaving the conductive layers, and a channel structure extending through the memory stack along a vertical direction. The channel structure has a plurality of protruding portions protruding along a lateral direction and facing the conductive layers, respectively, and a plurality of normal portions facing the dielectric layers, respectively, without protruding along the lateral direction. The channel structure includes a plurality of blocking structures in the protruding portions, respectively. A vertical dimension of each of the conductive layers is nominally the same as a vertical dimension of a respective one of the storage structures.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
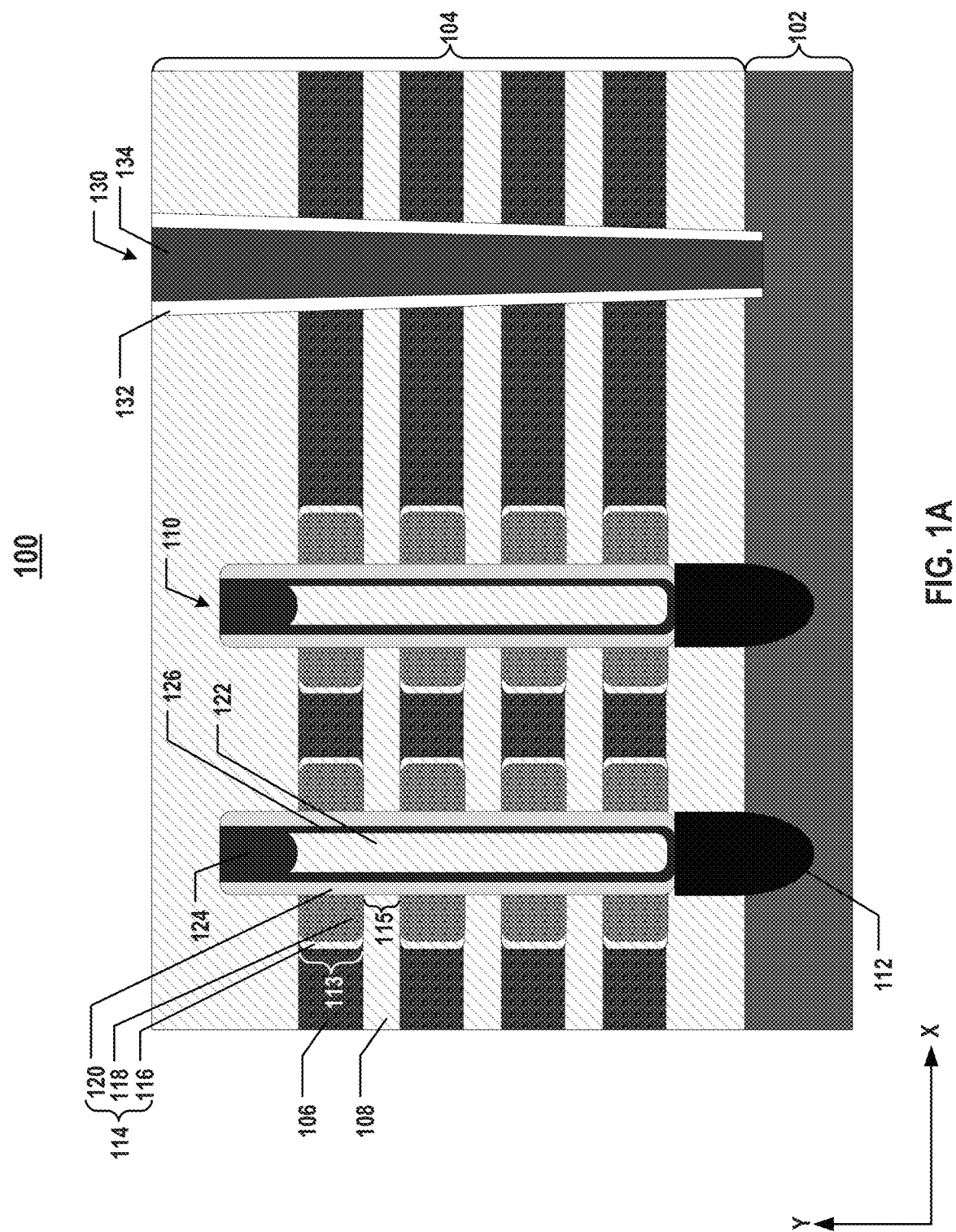
FIGS. 1A and 1B illustrate side views of cross-sections of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. As such, other configurations and arrangements can be used without departing from the scope of the present disclosure. Also, the present disclosure can also be employed in a variety of other applications. Functional and structural features as described in the present disclosures can be combined, adjusted, and modified with one another and in ways not specifically depicted in the drawings, such that these combinations, adjustments, and modifications are within the scope of the present discloses.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

Charge trapping is a semiconductor memory technology used in some memory devices, such as 3D NAND memory devices, which uses a silicon nitride film as the storage layer to store electrons. In some memory devices, the charge trapping layer (e.g., a silicon nitride film) of one memory cell is usually not isolated from the charge trapping layer of another memory cell along a cell string. But instead, a charge trapping layer may be shared among multiple memory cells in a memory string. In the situation where a charge layer is shared among multiple memory cells, the charge trapped for one memory cell may spread to another memory cell, thereby causing charge spreading (also known as charge migration) between adjacent memory cells. Charge spreading may become a problem for data retention properties and cause disturb issues as the 3D memory devices continue to scale up vertically and the cell size and spacing shrink aggressively.

Figure 6:
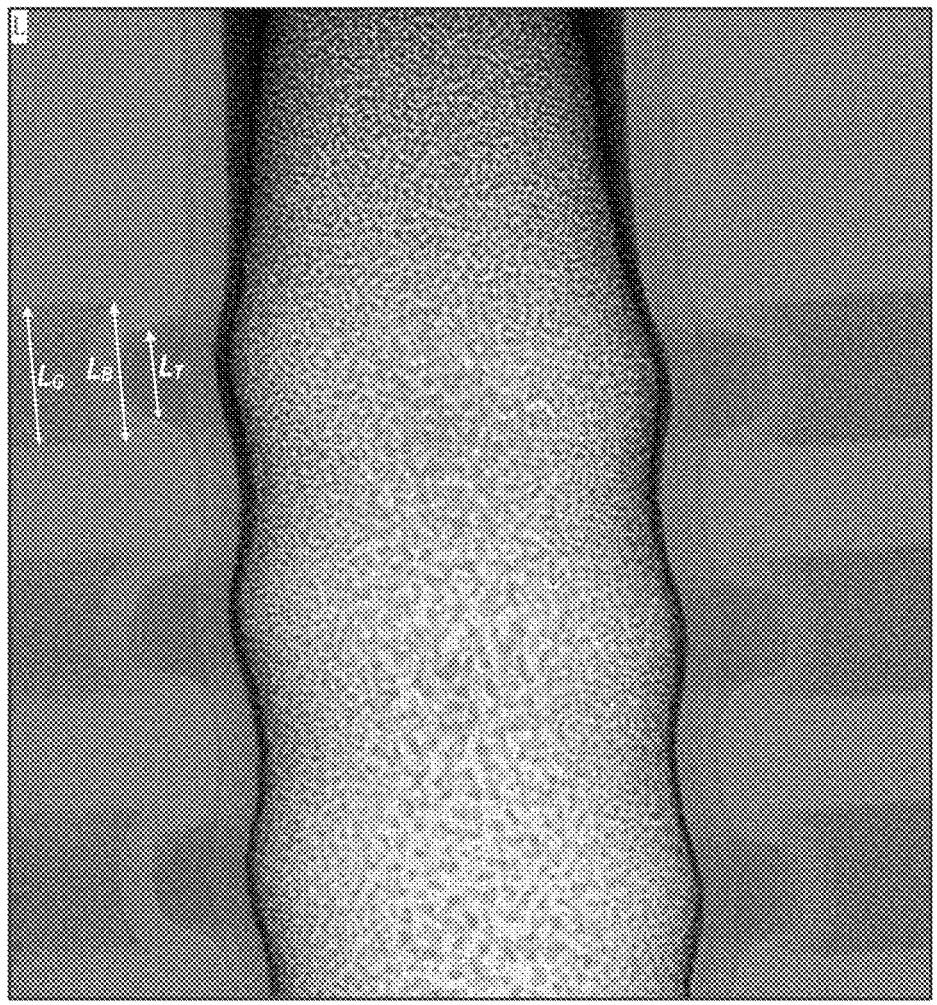
FIG. 6 illustrates an electron microscopy image of a channel structure.

One approach to avoiding the charge migration issue in the charge trapping layer is to cut the continuous silicon nitride film into separate portions for each memory cell, thereby physically preventing the charge from spreading between memory cells. The sidewall of each channel structure formed by such an approach usually has a serpentine profile in the side view, and the continuous blocking layer (i.e., the outmost layer of the channel structure) over which the charge trapping layer forms follows the serpentine profile, for example, as shown in FIG. 6. As a result, in each memory cell, the vertical dimension of the respective portion of the charge trapping layer (e.g., the trap length $L_T$ in FIG. 6) becomes smaller than the vertical dimension of the respective portion of the blocking layer (e.g., the blocking length $L_B$ in FIG. 6) and the respective gate length (e.g., $L_G$ in FIG. 6). In other words, part of the serpentine blocking layer extends laterally between each portion of the charge trapping layer and the gate-to-gate dielectrics, making the trap length $L_T$ smaller than the gate length $L_G$. The difference between the trap length $L_T$ and the gate length $L_G$ cause uneven distribution of the electric field in each memory cell, thereby affecting the performance of the 3D memory device.

To address the aforementioned issues, the present disclosure introduces a solution in which a channel structure having protruding portions in a 3D memory device, which has nominally the same trap length and gate length. In some embodiments, a plurality of blocking structures disconnected from one another, instead of the continuous blocking layer following the serpentine profile of the channel structure in some known solutions, do not extend laterally to occupy the spaces between each storage structure and the gate-to-gate dielectrics, which reduces the trap length of the storage structure in the known solutions. In some embodiments, the blocking structures extend laterally not only between the storage structures and the gate-to-gate dielectrics but also between the gate electrodes and the gate-to-gate dielectrics, to the same extend, thereby compensating the trap length reduction in the known solutions. As a result, the electric field in each memory cell can be more evenly distributed, making control of the memory cells more easily. The channel structures disclosed herein can be formed using various methods. In some embodiments, the blocking structures are formed lastly among the various layers of a channel structure, for example, during the gate-replacement process.

Figure 1B:
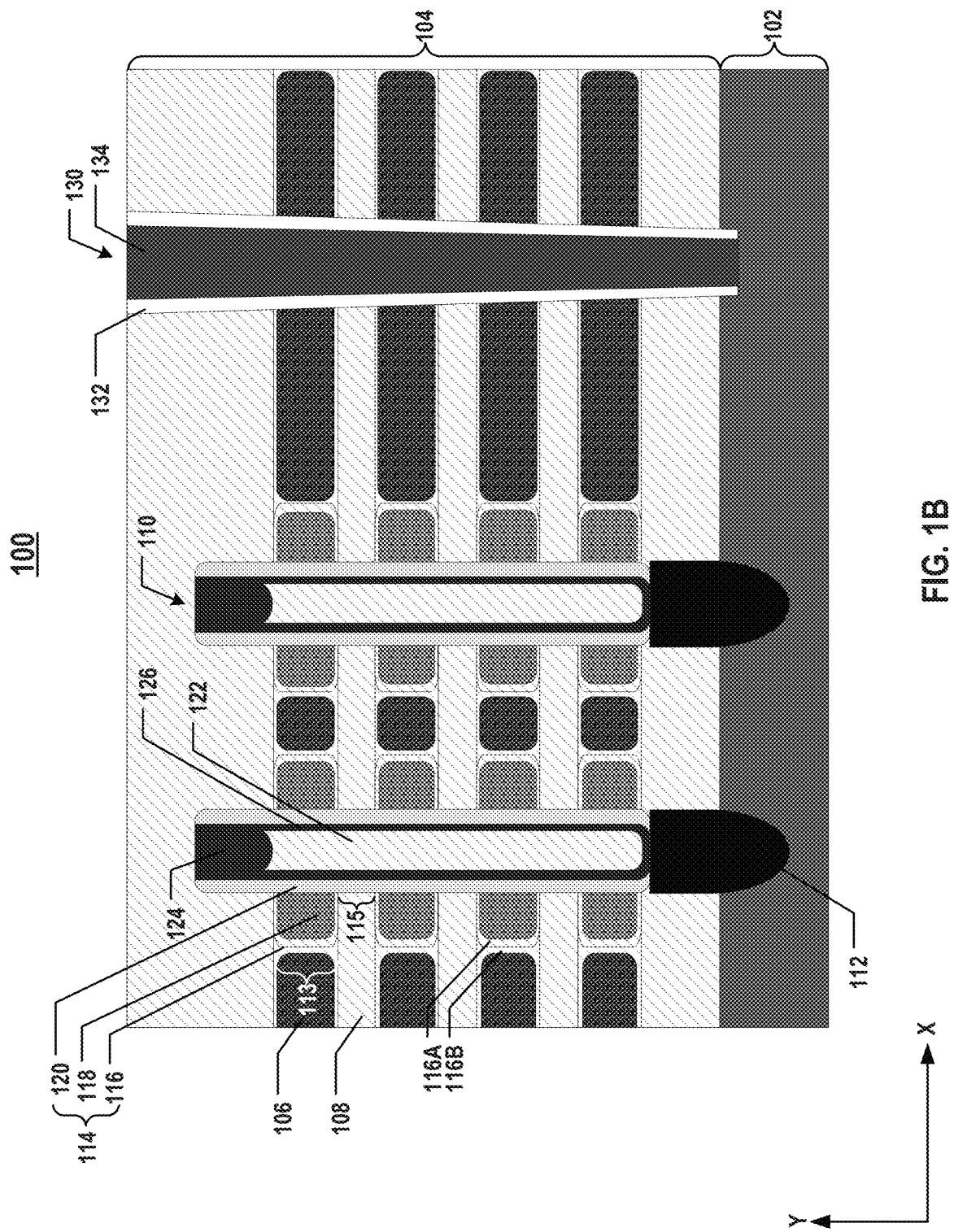

FIGS. 1A and 1B illustrate side views of cross-sections of an exemplary 3D memory device 100, according to some embodiments of the present disclosure. The 3D memory device 100 can include a substrate 102, which can include silicon (e.g., single crystalline silicon), silicon germanium (SiGe), gallium arsenide (GaAs), germanium (Ge), silicon on insulator (SOI), germanium on insulator (GOI), or any other suitable materials. In some embodiments, substrate 102 is a thinned substrate (e.g., a semiconductor layer), which was thinned by grinding, etching, chemical mechanical polishing (CMP), or any combination thereof. It is noted that x- and y-axes are included in FIGS. 1A and 1B to further illustrate the spatial relationship of the components in 3D memory device 100. Substrate 102 of 3D memory device 100 includes two lateral surfaces (e.g., a top surface and a bottom surface) extending laterally in the x-direction (i.e., the lateral direction). As used herein, whether one component (e.g., a layer or a device) is "on," "above," or "below" another component (e.g., a layer or a device) of a 3D memory device (e.g., 3D memory device 100) is determined relative to the substrate of the 3D memory device (e.g., substrate 102) in the y-direction (i.e., the vertical direction) when the substrate is positioned in the lowest plane of the 3D memory device in the y-direction. The same notion for describing the spatial relationship is applied throughout the present disclosure.

3D memory device 100 can be part of a monolithic 3D memory device. The term "monolithic" means that the components (e.g., the peripheral device and memory array device) of the 3D memory device are formed on a single substrate. For monolithic 3D memory devices, the fabrication encounters additional restrictions due to the convolution of the peripheral device processing and the memory array device processing. For example, the fabrication of the memory array device (e.g., NAND memory strings) is constrained by the thermal budget associated with the peripheral devices that have been formed or to be formed on the same substrate.

Alternatively, 3D memory device 100 can be part of a non-monolithic 3D memory device, in which components (e.g., the peripheral device and memory array device) can be formed separately on different substrates and then bonded, for example, in a face-to-face manner. In some embodiments, the memory array device substrate (e.g., substrate 102) remains as the substrate of the bonded non-monolithic 3D memory device, and the peripheral device (e.g., including any suitable digital, analog, and/or mixed-signal peripheral circuits used for facilitating the operation of 3D memory device 100, such as page buffers, decoders, and latches; not shown) is flipped and faces down toward the memory array device (e.g., NAND memory strings) for hybrid bonding. It is understood that in some embodiments, the memory array device substrate (e.g., substrate 102) is flipped and faces down toward the peripheral device (not shown) for hybrid bonding, so that in the bonded non-monolithic 3D memory device, the memory array device is above the peripheral device. The memory array device substrate (e.g., substrate 102) can be a thinned substrate (which is not the substrate of the bonded non-monolithic 3D memory device), and the back-end-of-line (BEOL) interconnects of the non-monolithic 3D memory device can be formed on the backside of the thinned memory array device substrate.

In some embodiments, 3D memory device 100 is a NAND Flash memory device in which memory cells are provided in an array of NAND memory strings extending vertically above substrate 102. Each NAND memory string can be in the form of a channel structure 110 that extends through a plurality of pairs each including a conductive layer 106 and a dielectric layer 108 (referred to herein as "conductive/dielectric layer pairs"). The stacked conductor/dielectric layer pairs are also referred to herein as a "memory stack" 104. In some embodiments, a pad layer (not shown), such as a silicon oxide layer, is formed between substrate 102 and memory stack 104. The number (e.g., 32, 64, 96, 128, 160, 192, 224, 256, etc.) of the conductive/dielectric layer pairs in memory stack 104 can determine the number of memory cells in 3D memory device 100. Memory stack 104 can include a plurality of vertically interleaved conductive layers 106 and dielectric layers 108. Conductive layers 106 and dielectric layers 108 in memory stack 104 can alternate in the vertical direction. Conductive layers 106 can include conductive materials including, but not limited to, tungsten (W), cobalt (Co), copper (Cu), aluminum (Al), polysilicon, doped silicon, silicides, or any combination thereof. Each conductive layer 106 can include a gate electrode (gate line) surrounded by an adhesive layer and a gate dielectric layer. The gate electrode of conductive layer 106 can extend laterally as a word line, ending at one or more staircase structures of memory stack 104. Dielectric layers 108 can include dielectric materials including, but not limited to, silicon oxide, silicon nitride, silicon oxynitride, or any combination thereof. Although not shown, it is understood that in some embodiments, memory stack 104 has a multiple-deck architecture, which includes a plurality of memory decks stacked over one another to increase the number of the conductor/dielectric layer pairs.

As shown in FIGS. 1A and 1B, channel structure 110 can include a semiconductor plug 112 in the lower portion (e.g., at the lower end) of channel structure 110. As used herein, the "upper end" of a component (e.g., channel structure 110) is the end farther away from substrate 102 in the y-direction, and the "lower end" of the component (e.g., channel structure 110) is the end closer to substrate 102 in the y-direction when substrate 102 is positioned in the lowest plane of 3D memory device 100. Semiconductor plug 112 can include a single crystalline semiconductor material (also known as "monocrystalline semiconductor material"), such as single crystalline silicon, which in some instances is epitaxially grown from substrate 102 in any suitable directions. In a single crystalline material, the crystal lattice of the entire sample can be continuous and unbroken to the edges of the sample, with no grain boundaries. In some embodiments, semiconductor plug 112 includes single crystalline silicon, the same material of substrate 102. In other words, semiconductor plug 112 can include an epitaxially-grown semiconductor layer that is the same as the material of substrate 102. For example, substrate 102 may be a silicon substrate, and semiconductor plug 112 may be a single crystalline silicon plug. Semiconductor plug 112 can function as a channel controlled by a source select gate of channel structure 110.

As shown in FIGS. 1A and 1B, above semiconductor plug 112, channel structure 110 can have protruding portions 113 and normal portions 115 interleaving producing portions 113 in the vertical direction (e.g., the y-direction). Protruding portions 113 of channel structure 110 face conductive layers 106 of memory stack 104, and normal portions 115 of channel structure 110 face dielectric layers 108 of memory stack 104, according to some embodiments. In some embodiments, compared with normal portions 115, each protruding portion 113 protrudes into a respective conductive layer 106 laterally (e.g., in the x-direction in FIGS. 1A and 1B). In contrast, each normal portion 115 faces a respective dielectric layer 108 without protruding laterally, according to some embodiments. That is, the lateral dimension (e.g., in the x-direction in FIGS. 1A and 1B) of protruding portion 113 can be greater than the lateral dimension of normal portion 115 of channel structure 110. As a result, in some embodiments, the sidewall of channel structure 110 has a serpentine profile in the side view, as shown in FIGS. 1A and 1B.

As shown in FIGS. 1A and 1B, channel structure 110 can also include an opening filled with semiconductor material(s) (e.g., as a semiconductor channel 126) and dielectric material(s) (e.g., as a memory film 114). In some embodiments, memory film 114 is a composite layer above semiconductor plug 112 and along the sidewall of channel structure 110. It is understood that in some examples, the bottom of memory film 114 may further extend laterally over the top surface of semiconductor plug 112. In some embodiments, memory film 114 includes a plurality of blocking structures 116, a plurality of storage structures 118, and a tunneling layer 120 from the sidewall toward the center of channel structure 110 in this order.

Different from the blocking layer in the known solutions, which is a continuous layer formed over and along the sidewall of a channel structure, following the serpentine profile of the sidewall of the channel structure in the side view, as shown in FIG. 1A, blocking structures 116 (also known as a blocking oxide) are discrete structures in protruding portions 113, but not in normal portions 115, of channel structure 110, according to some embodiments. That is, blocking structures 116 are disconnected from one another in normal portions 115 of channel structure 110, i.e., not continuous in protruding portions 113 and normal portions 115, according to some embodiments. Blocking structure 116 can include silicon oxide, silicon oxynitride, high dielectric constant (high-k) dielectrics, or any combination thereof. In some embodiments, blocking structures 116 include silicon oxide. In some embodiments, a gate dielectric layer (not shown) is disposed laterally between each blocking structure 116 and a respective conductive layer 106. For example, the gate dielectric layer may include high dielectric constant (high-k) dielectrics including, but not limited to, aluminum oxide ($Al_2O_3$), hafnium oxide ($HfO_2$), zirconium oxide ($ZnO_2$), tantalum oxide ($Ta_2O_5$), etc.

As shown in FIG. 1A, multiple storage structures 118 (also known as a storage nitride) can be formed over multiple blocking structures 116, respectively. Storage structures 118 can include silicon nitride, silicon oxynitride, silicon, or any combination thereof. In some embodiments, storage structures 118 include silicon nitride. Storage structures 118 are disposed in protruding portions 113 of channel structure 110, according to some embodiments. That is, each protruding portion 113 of channel structure 110 can include a respective blocking structure 116 and a respective storage structure 118A over blocking structure 116. Different from the continuous blocking layer in the known solutions, which extends laterally between the storage structure and the respective pair of the dielectric layers (i.e., the gate-to-gate dielectrics), disconnected blocking structures 116 in FIG. 1A do not occupy the space vertically between each storage structure 118 and a respective par of dielectric layers 108 (above and below storage structure 118), according to some embodiments. As a result, each storage structure 118 can be vertically in contact with a respective pair of dielectric layers 108 of memory stack 104. Accordingly, the vertical dimension (i.e., the trap length $L_T$) of storage structure 118 is nominally the same as the vertical dimension (i.e., the blocking length $L_B$) of blocking structure 116, according to some embodiments. In some embodiments, since the vertical dimension (i.e., the blocking length $L_B$) of blocking structure 116 is nominally the same as the vertical dimension (i.e., the gate length $L_G$) of conductive layer 106 (i.e., the gate electrode of a memory cell), the vertical dimension (i.e., the trap length $L_T$) of storage structure 118 is nominally the same as the vertical dimension (i.e., the gate length $L_G$) of conductive layer 106 (i.e., the gate electrode) as well. This is different from the channel structure in the known solutions in which the trap length $L_T$ is smaller than the gate length $L_G$ and the blocking length $L_B$ (e.g., shown in FIG. 6).

Each storage structure 118 in protruding portion 113 can be coplanar with a respective conductive layer 106 and can be affected by the electric field generated by conductive layer 106 (i.e., the gate electrode of a memory cell). As a result, storage structure 118 can store charges, for example, electrons or holes from semiconductor channel 126. The storage or removal of charges in storage structure 118 can impact the on/off state and/or the conductance of semiconductor channel 126. Because each conductive layer 106 and a respective storage structure 118 can have nominally the same vertical dimension, the electric field created by conductive layer 106 and applied to storage structure 118 can be more uniform in channel structure 110, compared with known solutions, thereby making the control of the storage or removal of charges in storage structure 118 more easily.

As shown in FIG. 1B, each blocking structure 116 can extend laterally in both directions of the x-direction, such part of blocking structure 116 is between a respective storage structure 118 and a respective pairs of dielectric layers 108 (e.g., the gate-to-gate dielectrics), and another part of blocking structure 116 is between a respective conductive layer 106 (e.g., the gate electrode) and a respective pairs of dielectric layers 108. That is, blocking structure 116 includes three parts: a first part laterally between conductive layer 106 and storage structure 118, a second part vertically between storage structure 118 and dielectric layers 108, and a third part vertically between conductive layer 106 and dielectric layers 108, according to some embodiments. In some embodiments, the vertical dimensions of the second and third parts of blocking structure 116 are nominally the same, such that the vertical dimension (i.e., the gate length $L_G$) of conductive layer 106 of is still nominally the same as the vertical dimension (i.e., the trap length $L_T$) of storage structure 118, which is smaller than the vertical dimension (i.e., the blocking length $L_B$) of blocking structure 116.

As described below in detail with respect to the fabrication process, blocking structure 116 include two blocking structures 116A and 116B formed in two different processes. As shown in FIG. 1B, first blocking structure 116A may be in contact with storage structure 118, and second blocking structure 116B may be in contact with conductive layer 106. For example, storage structure 118 may be first formed over first blocking structure 116A, and conductive layer 106 may be formed later over second blocking structure 116B. In some embodiments, first and second blocking structure 116A and 116B have the same material, for example, silicon oxide. It is understood that in some examples in which dielectric layers 108 and first and second blocking structures 116A and 116B (blocking structure 116) include the same material, for example, silicon oxide, the interface and boundary between dielectric layers 108 and blocking structure 116 may become indistinguishable and may not be discerned in 3D memory device 100. Nevertheless, because each conductive layer 106 and a respective storage structure 118 can have nominally the same vertical dimension, the electric field created by conductive layer 106 and applied to storage structure 118 can be more uniform in channel structure 110, compared with known solutions, thereby making the control of the storage or removal of charges in storage structure 118 more easily.

Although blocking structures 116 are shown as disconnected from one another in FIG. 1B, it is understood that in some examples, blocking structures 116 may be parts of a continuous storage layer. For example, blocking structures 116 may further extend vertically in normal portions 115 of channel structure 110, such that every two blocking structures 116 in adjacent protruding portions of channel structure 110 may be connected by an extending portion (not shown) in a respective normal portion 115 of channel structure 110 therebetween. Although storage structures 118 are shown as disconnected from one another in FIGS. 1A and 1B, it is understood that in some examples, storage structures 118 may be parts of a continuous storage layer. For example, a storage layer may include storage structures 118 in protruding portions 113 of channel structure 110 and protecting structures (not shown) connecting storage structures 118 in normal portions 115 of channel structure 110. In some embodiments, each protecting structure in normal portion 115 of channel structure 110 is coplanar with a respective dielectric layer 108 (e.g., the gate-to-gate dielectric) and may not be affected by the electric field generated by conductive layer 106. Instead of storing charges, the protecting structure can connect adjacent storage structures 118 and protect dielectric layers 108 during the fabrication process of 3D memory device 100.

As shown in FIGS. 1A and 1B, tunneling layer 120 (also known as a tunnel oxide) can be formed over storage structures 118. In some embodiments, the thickness of tunneling layer 120 is nominally the same. Tunneling layer 120 is continuous in protruding portions 113 and in normal portions 115, according to some embodiments. Thus, the thicknesses of tunneling layer 120 in protruding portion 113 and normal portion 115 of channel structure 110 can be nominally the same. Charges, for example, electrons or holes from semiconductor channel 126 can tunnel through tunneling layer 120 to storage structures 118. Tunneling layer 120 can include silicon oxide, silicon oxynitride, or any combination thereof. In some embodiments, blocking structure 116 includes silicon oxide, storage structure 118 includes silicon nitride, and tunneling layer 120 includes silicon oxide. Memory film 114 thus may be referred to as an "ONO" memory film for charge trapping-type of 3D NAND Flash memory.

As shown in FIGS. 1A and 1B, semiconductor channel 126 can be formed over tunneling layer 120. In some embodiments, the thickness of semiconductor channel 126 is nominally the same over tunneling layer 120. Semiconductor channel 126 is continuous in protruding portions 113 and in normal portions 115, according to some embodiments. Thus, the thicknesses of semiconductor channel 126 in protruding portion 113 and normal portion 115 of channel structure 110 can be nominally the same. Semiconductor channel 126 can provide charges, for example, electrons or holes, to storage structures 118, tunneling through tunneling layer 120. Semiconductor channel 126 can include silicon, such as amorphous silicon, polysilicon, or single crystalline silicon. In some embodiments, semiconductor channel 126 includes polysilicon. As shown in FIGS. 1A and 1B, in some embodiments, the bottom portion of semiconductor channel 126 extends vertically through the bottom of tunneling layer 120 to be in contact with semiconductor plug 112, such that semiconductor plug 112 is electrically connected to semiconductor channel 126. In some embodiments, the remaining space of channel structure 110 is partially or fully filled with a capping layer 122 (with or without an air gap therein) including dielectric materials, such as silicon oxide. Capping layer 122 may be formed over semiconductor channel 126. In some embodiments, each memory cell of the NAND memory string includes a respective blocking structure 116, a respective storage structure 118, and parts of tunneling layer 120 and semiconductor channel 126 in a respective protruding portion 113 of channel structure 110.

In some embodiments, channel structure 110 further includes a channel plug 124 in the upper portion (e.g., at the upper end) of channel structure 110. Channel plug 124 can be above and in contact with the upper end of semiconductor channel 126 to increase the contact area for bit line contact. Channel plug 124 can include semiconductor materials (e.g., polysilicon). By covering the upper end of channel structure 110 during the fabrication of 3D memory device 100, channel plug 124 can function as an etch stop layer to prevent etching of dielectrics filled in channel structure 110, such as silicon oxide and silicon nitride. In some embodiments, channel plug 124 also functions as part of the drain of the NAND memory string.

Figure 3A:
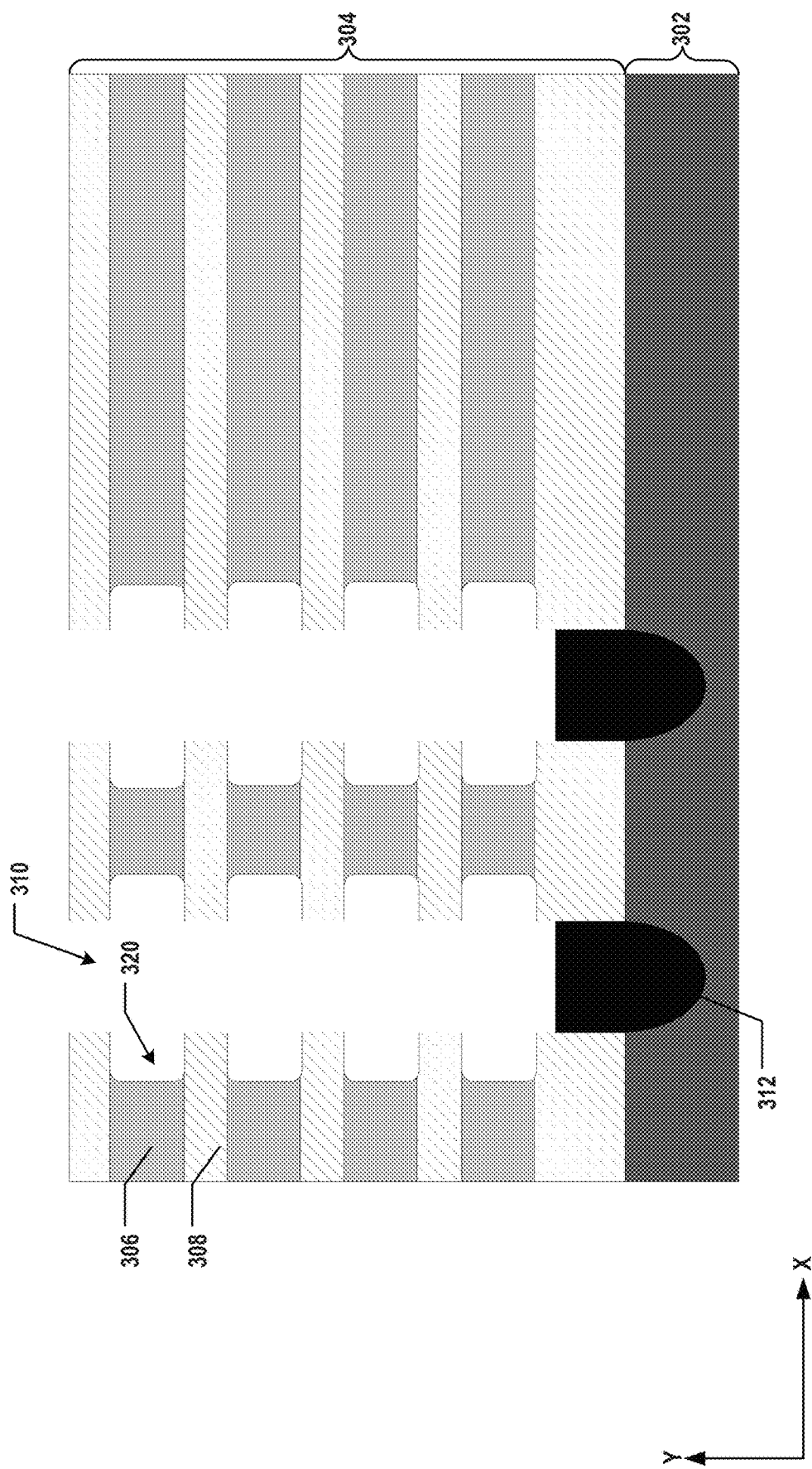
FIGS. 3A-3E illustrate another exemplary fabrication process for forming a 3D memory device, according to some embodiments of the present disclosure.
Figure 3B:
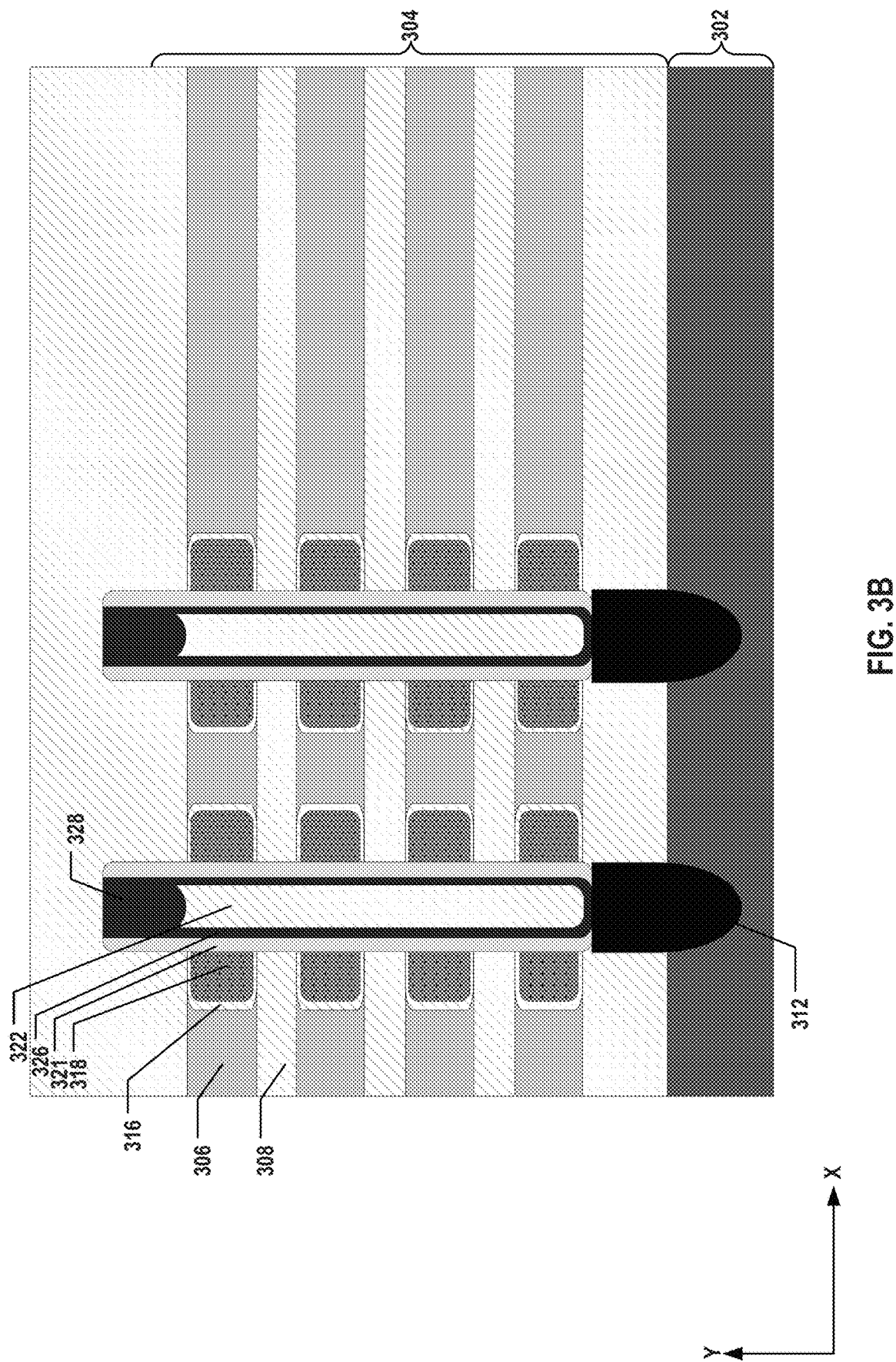
Figure 3C:
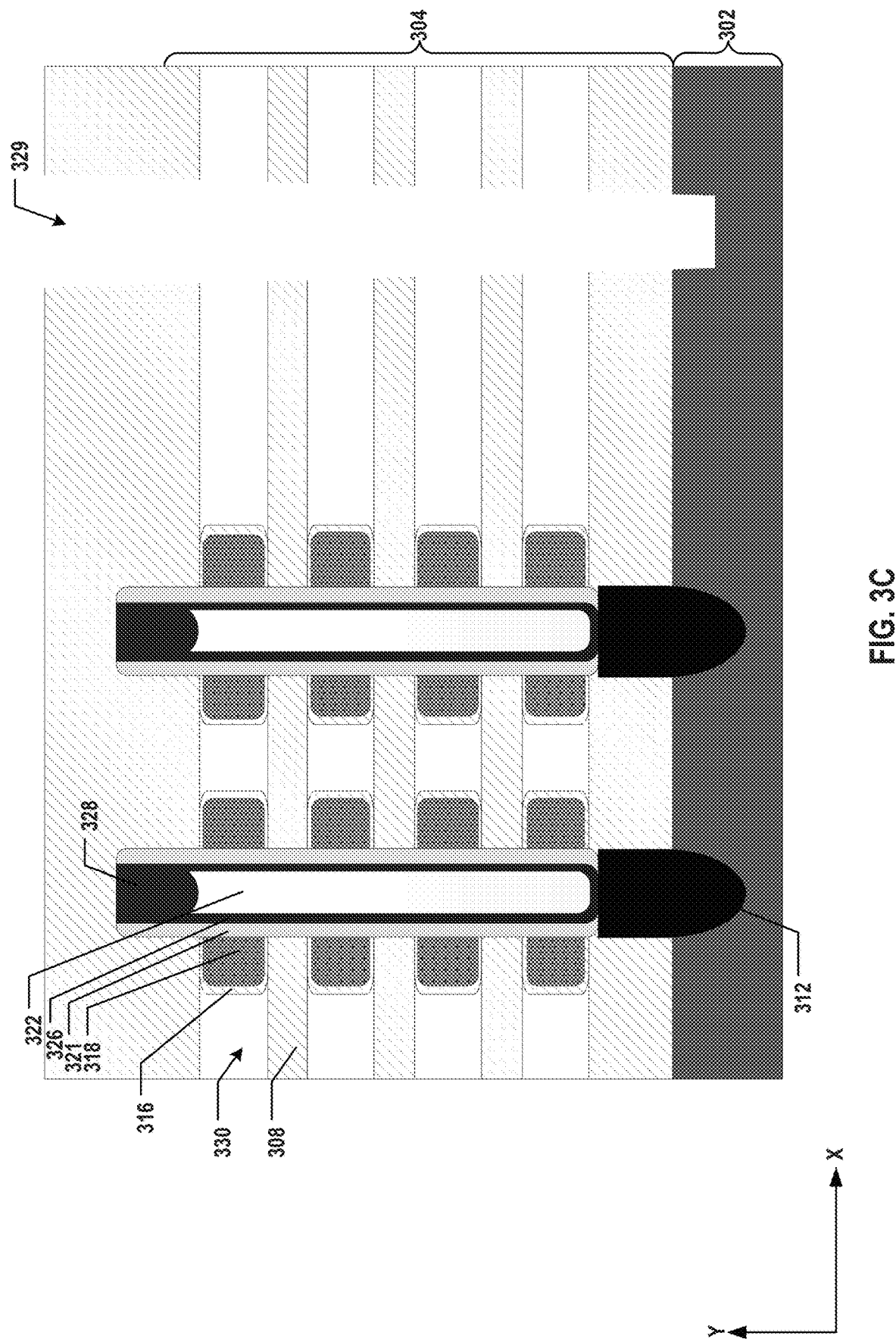
Figure 3D:
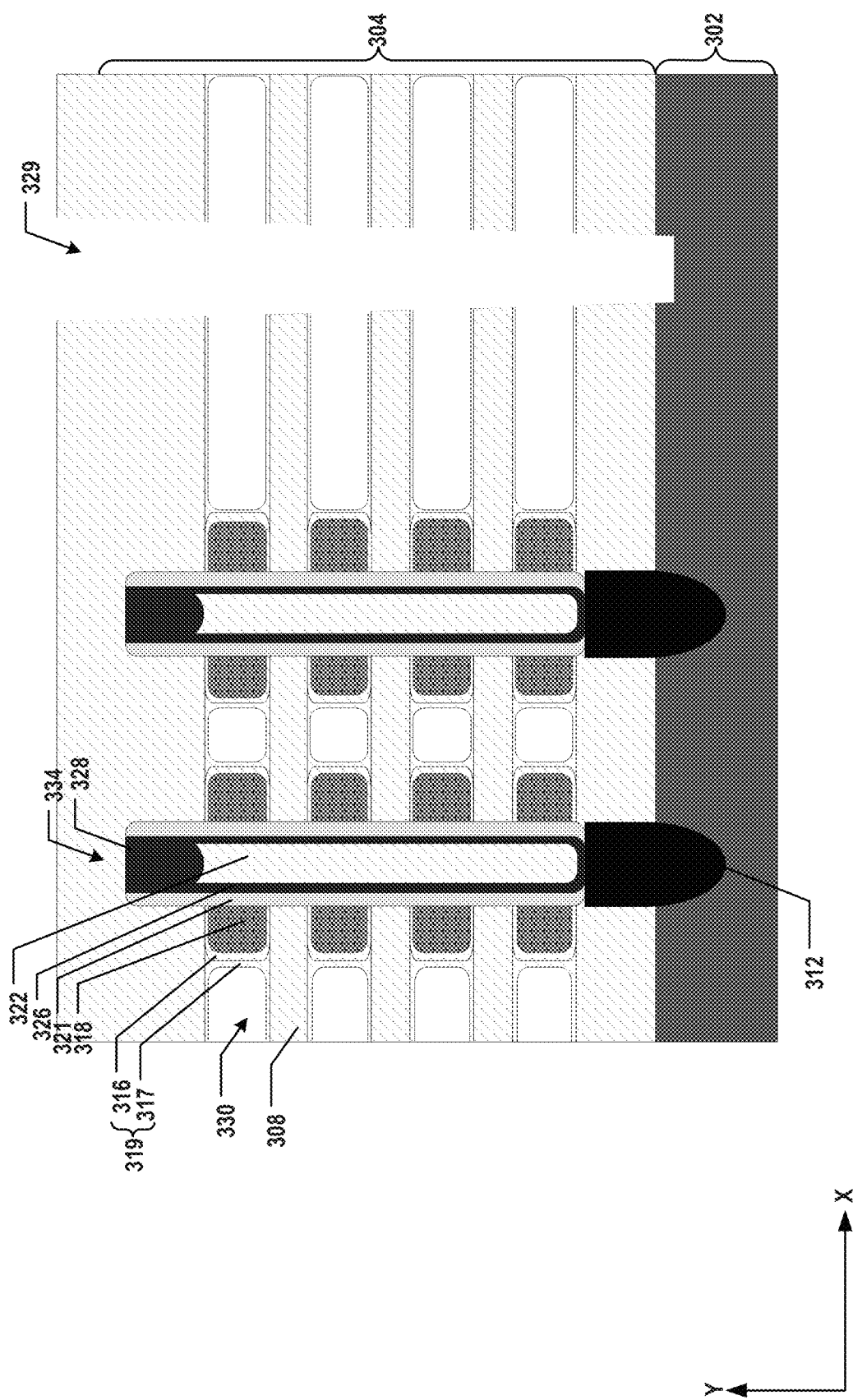

As shown in FIG. 1A, 3D memory device 100 can further include a slit structure 130 (e.g., a gate line slit (GLS)) extending vertically through memory stack 104. Each slit structure 130 can extend laterally (e.g., the word line direction) to divide memory stack 104 into multiple areas, such as memory blocks. In some embodiments, slit structure 130 is a source contact structure including a spacer 132 and a source contact 134 each extending vertically through memory stack 104. Spacer 132 can include dielectric materials, such as silicon oxide, laterally between source contact 134 and memory stack 104 to electrically separate source contact 134 from surrounding conductive layers 106 in memory stack 104. In some embodiments, source contact 134 includes an adhesion layer and a conductive layer surrounded by the adhesion layer. The adhesion layer can include one or more conductive materials, such as titanium nitride (TiN), above and in contact with substrate 102 to make an electrical connection with substrate 102. In some embodiments, the conductive layer includes polysilicon in its lower portion and a metal (e.g., W) in its upper portion contacting a metal interconnect (not shown). Although not shown in FIGS. 1A and 1B, it is understood that in some examples, slit structure 130 may be an insulating structure that does not include any contact therein (i.e., not functioning as the source contact). The insulating structure may include an opening (e.g., a slit) filled with one or more dielectric materials, including, but not limited to, silicon oxide, silicon nitride, silicon oxynitride, or any combination thereof.

Although not shown in FIGS. 1A and 1B, it is understood that any other suitable components may be included as part of 3D memory device 100. For example, local contacts, such as bit line contacts, word line contacts, and source line contacts, may be included in 3D memory device 100 for pad-out, i.e., electrically connecting channel structures 110 for metal routing to interconnects (e.g., middle-end-of-line (MEOL) interconnects and BEOL interconnects). In some embodiments, 3D memory device 100 further includes peripheral circuits, such as any suitable digital, analog, and/or mixed-signal peripheral circuits used for facilitating the operation of 3D memory device 100. For example, the peripheral circuits can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors).

Figure 4:
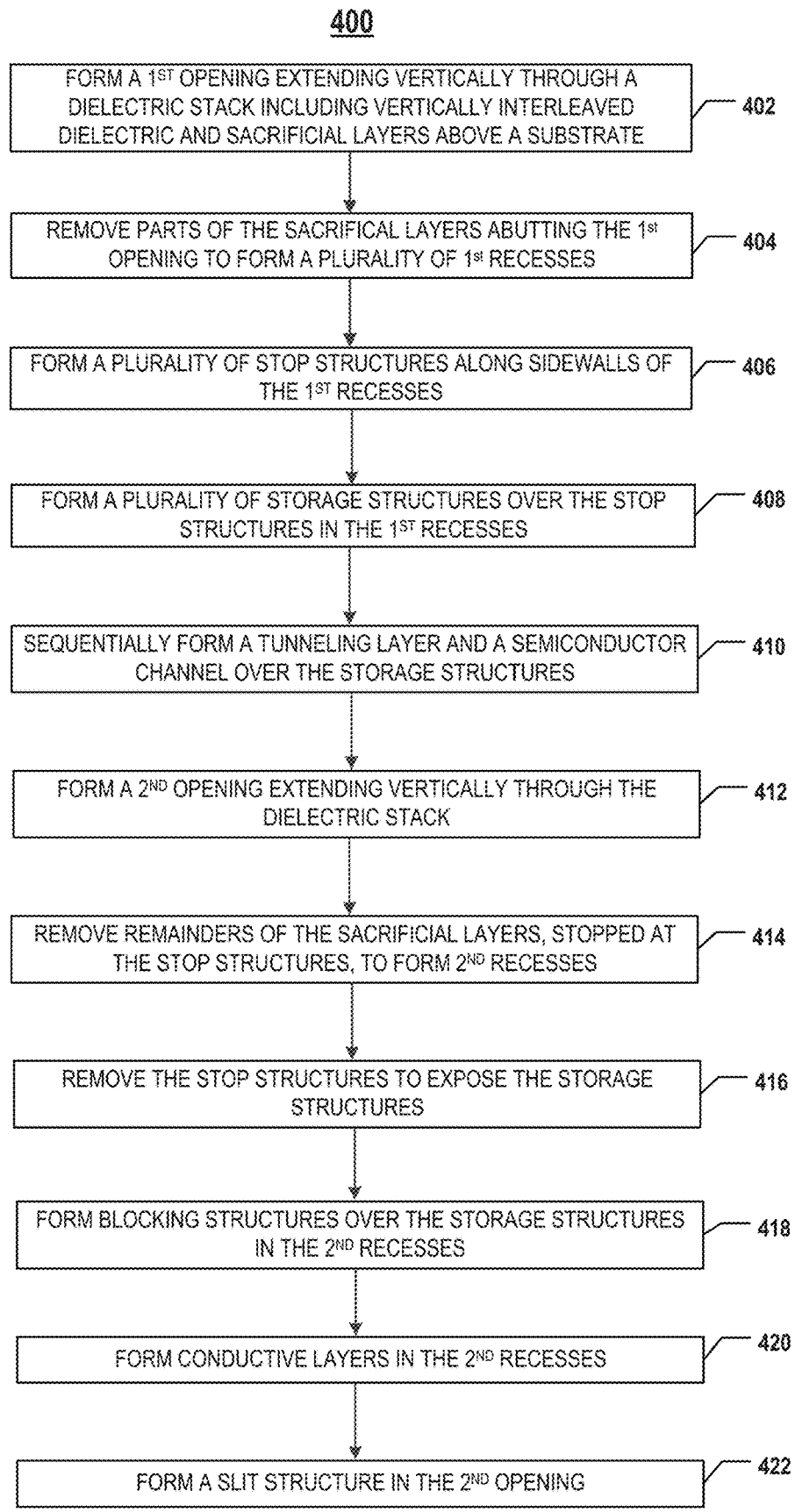
FIG. 4 illustrates a flowchart of an exemplary method for forming a 3D memory device, according to some embodiments of the present disclosure.

FIGS. 2A-2G illustrate an exemplary fabrication process for forming a 3D memory device, according to some embodiments of the present disclosure. FIG. 4 illustrates a flowchart of an exemplary method 400 for forming a 3D memory device, according to some embodiments of the present disclosure. Examples of the 3D memory device depicted in FIGS. 2A-2G and FIG. 4 includes 3D memory device 100 depicted in FIG. 1A. FIGS. 2A-2G and FIG. 4 will be described together. It is understood that the operations shown in method 400 are not exhaustive and that other operations can be performed as well before, after, or between any of the illustrated operations. Further, some of the operations may be performed simultaneously, or in a different order than shown in FIG. 4.

Referring to FIG. 4, method 400 starts at operation 402, in which a first opening extending vertically through a dielectric stack above a substrate is formed. The dielectric stack can include a plurality of vertically interleaved dielectric layers and sacrificial layers. The substrate can be a silicon substrate.

Figure 2A:
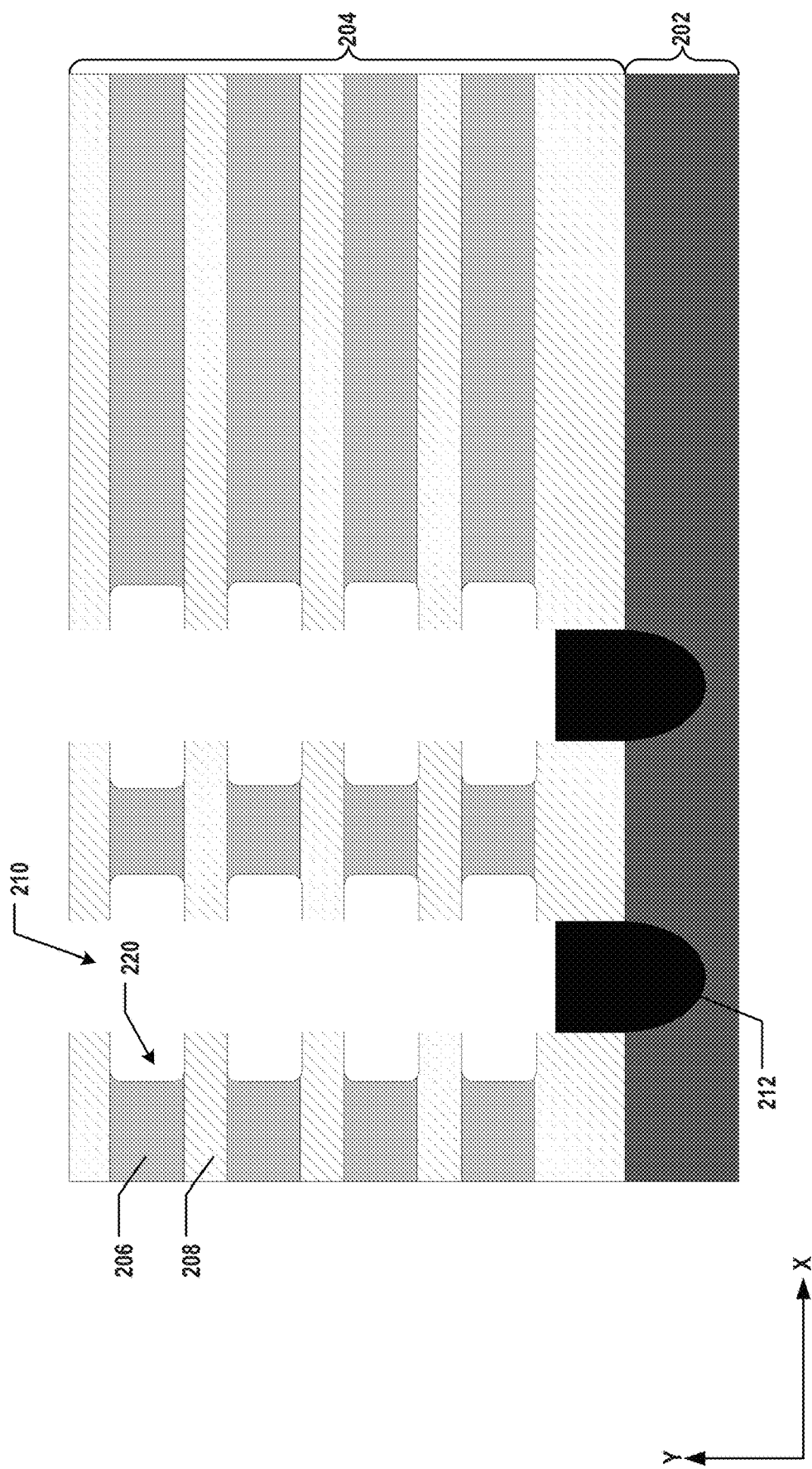
FIGS. 2A-2G illustrate an exemplary fabrication process for forming a 3D memory device, according to some embodiments of the present disclosure.

As illustrated in FIG. 2A, a dielectric stack 204 including vertically interleaved first dielectric layers 208 and second dielectric layers (referred to herein as "sacrificial layers" 206, together referred to herein as "dielectric layer pairs") are formed above a silicon substrate 202. In some embodiments, a pad layer (not shown) is formed between dielectric stack 204 and silicon substrate 202 by depositing dielectric materials, such as silicon oxide, or thermal oxidation, on silicon substrate 202 prior to the formation of dielectric stack 204. Dielectric layers 208 and sacrificial layers 206 can be alternatively deposited above silicon substrate 202 to form dielectric stack 204. In some embodiments, each dielectric layer 208 includes a layer of silicon oxide, and each sacrificial layer 206 includes a layer of silicon nitride. Dielectric stack 204 can be formed by one or more thin film deposition processes including, but not limited to, chemical vapor deposition (CVD), physical vapor deposition (PVD), atomic layer deposition (ALD), or any combination thereof.

As illustrated in FIG. 2A, an opening 210 is formed extending vertically through dielectric stack 204. In some embodiments, a plurality of openings 210 are formed through dielectric stack 204, such that each opening 210 becomes the location for growing an individual channel structure in the later process. In some embodiments, fabrication processes for forming opening 210 include wet etching and/or dry etching, such as deep-ion reactive etching (DRIE). In some embodiments, opening 210 extends further through the top portion of silicon substrate 202. The etching process through dielectric stack 204 may not stop at the top surface of silicon substrate 202 and may continue to etch part of silicon substrate 202. In some embodiments, a separate etching process is used to etch part of silicon substrate 202 after etching through dielectric stack 204.

As illustrated in FIG. 2A, in some embodiments, a single crystalline silicon plug 212 is formed by selectively filling the lower portion of opening 210 with single crystalline silicon epitaxially grown from silicon substrate 202 in any suitable direction (e.g., from the bottom surface and/or side surface). The fabrication processes for growing single crystalline silicon plug 212 can include, but not limited to, vapor-phase epitaxy (VPE), liquid-phase epitaxy (LPE), molecular-beam epitaxy (MPE), or any combinations thereof.

Method 400 proceeds to operation 404, as illustrated in FIG. 4, in which parts of the sacrificial layers facing the opening are removed to form a plurality of first recesses. In some embodiments, to remove the parts of the sacrificial layers, the parts of the sacrificial layers are wet etched selective to the dielectric layers.

As shown in FIG. 2A, a plurality of recesses 220 are formed by removing parts of sacrificial layers 206 facing the sidewall of opening 210. Recesses 220 are formed laterally between sacrificial layers 206 and opening 210, according to some embodiments. Recesses 220 can be formed by etching back sacrificial layers 206 using wet etching selective to dielectric layers 208 through opening 210. In some embodiments in which sacrificial layers 206 include silicon nitride and dielectric layers 208 include silicon oxide, a wet etchant including phosphoric acid is applied through opening 210 to etch parts of sacrificial layers 206 facing opening 210 to form recesses 220. By controlling the etch rate and/or etch time, only parts of sacrificial layers 206 are etched with a desired lateral dimension, e.g., in the x-direction, according to some embodiments. It is understood that in some examples, the wet etching process for forming recesses 220 may be part of a cleaning process prior to forming single crystalline silicon plug 212. That is, single crystalline silicon plug 212 may be formed after the formation of recesses 220.

Method 400 proceeds to operation 406, as illustrated in FIG. 4, in which a plurality of stop structures are formed along sidewalls of the first recesses. In some embodiments, to form the plurality of stop structures, epitaxial layers are grown from the remainders of the sacrificial layers facing the sidewalls of the first recesses. The epitaxial layers can include polysilicon. In some embodiments, to form the plurality of stop structures, parts of the remainders of the sacrificial layers facing the sidewalls of the first recesses are oxidized.

Figure 2B:
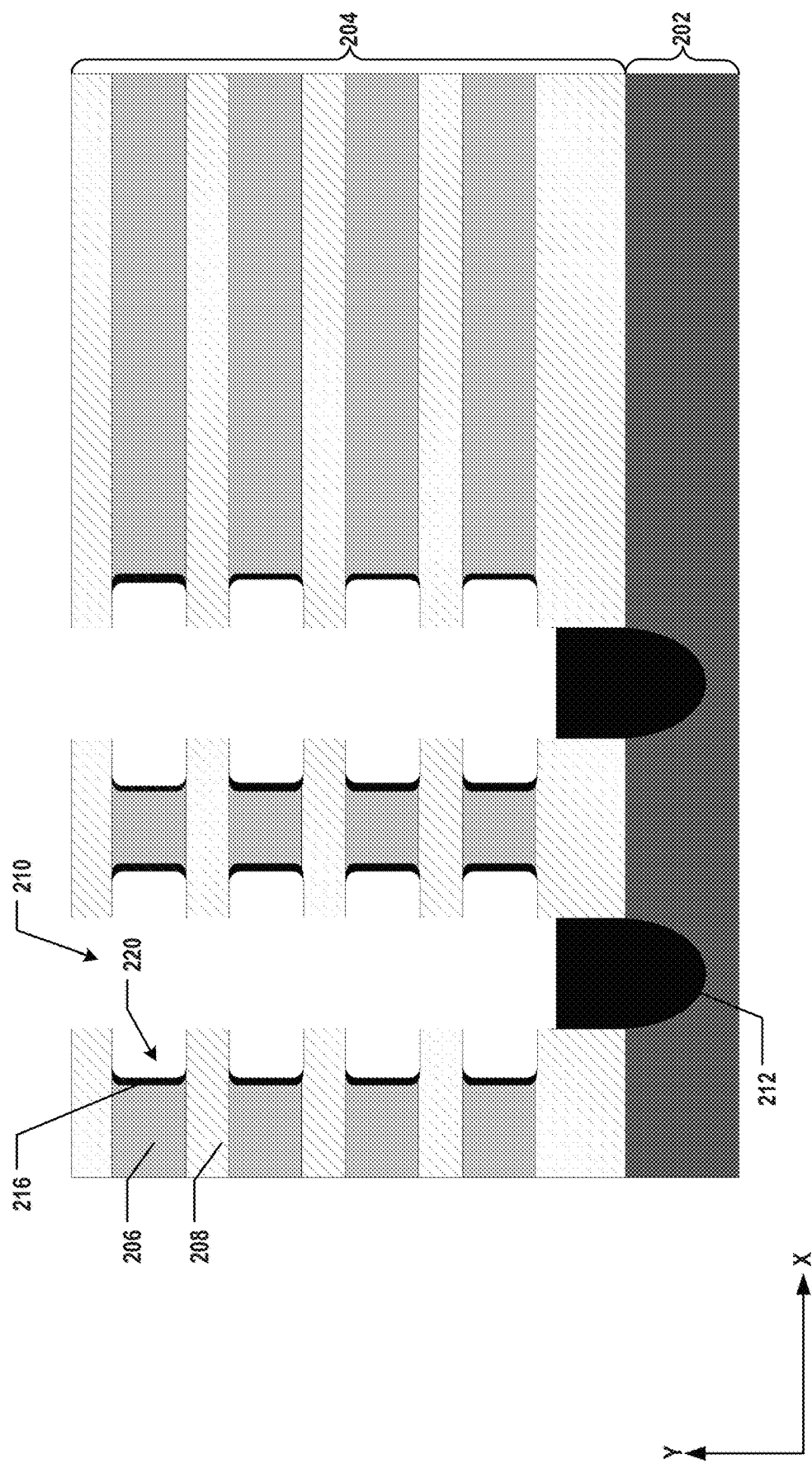

As illustrated in FIG. 2B, a plurality of stop structures 216 are formed along the sidewalls of recesses 220, respectively. The material of stop structures 216 can be different from the material of sacrificial layers 206, such that the etching of sacrificial layer 206 can be stopped at stop structures 216 as described below. In some embodiments, epitaxial layers are grown from the remainders of sacrificial layers 206 facing the sidewalls of recesses 220, respectively, in any suitable direction (e.g., from the side surfaces of the remainders of sacrificial layers 206) to form stop structures 216 in contact with the remainders of sacrificial layers 206. The epitaxial layers can include polysilicon or any other suitable materials depending on the materials of sacrificial layers 206. The fabrication processes for growing the epitaxial layers can include, but not limited to, VPE), liquid-phase epitaxy (LPE), molecular-beam epitaxy (MPE), or any combinations thereof.

In some embodiments, a respective part of each remainder of sacrificial layer 206 facing the sidewall of a respective recess 220 is oxidized to form native oxide as a respective stop structure 216. The oxidation process can be performed by a thermal oxidation process and or a chemical oxidation process. In some embodiments in which sacrificial layer 206 includes silicon nitride, stop structure 216 includes silicon oxide. It is understood that depending on the oxidization processes (e.g., the extent to which nitrogen atoms and ions are removed from the native oxide), stop structure 216 can be entirely silicon oxide, entirely silicon oxynitride, and a mixture of silicon oxide and silicon oxynitride. In some embodiments, the part of the remainder of sacrificial layer 206 is oxidized by a thermal oxidation process. Either dry oxidation using molecular oxygen as the oxidant or wet oxidation using water vapor as the oxidant can be used to form stop structure 216 at a temperature, for example, not greater than about 850° C. For example, the thermal oxidation may include an in situ steam generation (ISSG) process, which uses oxygen gas and hydrogen gas to create water in the form of steam. In some embodiments, the thickness of the epitaxial layer is greater than the thickness of the native oxide in forming stop structures 216.

Figure 2C:
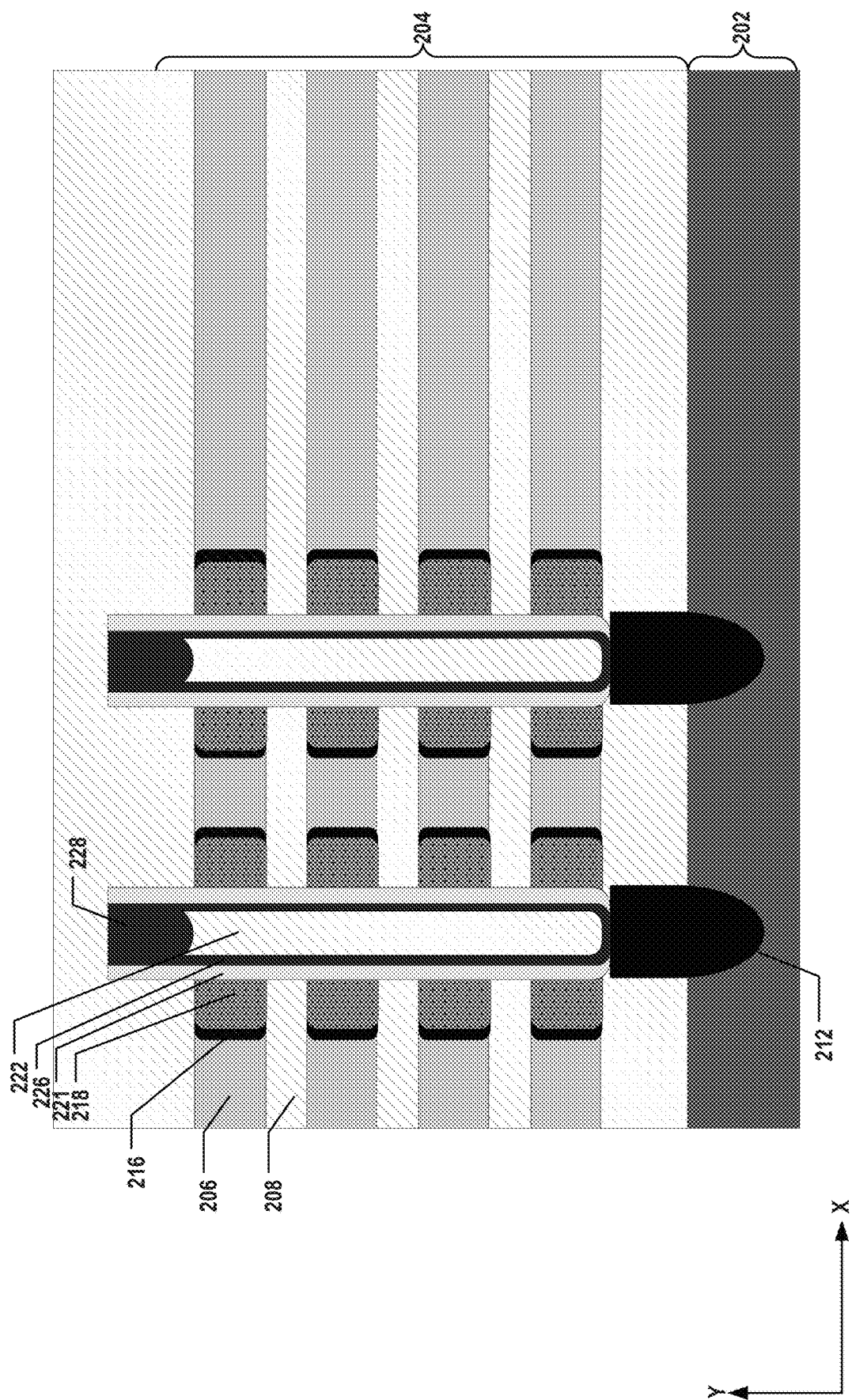

Method 400 proceeds to operation 408, as illustrated in FIG. 4, in which a plurality of storage structures are formed over the stop structures in the plurality of first recesses. As illustrated in FIG. 2C, storage structures 218 are formed over stop structures 216 in recesses 220 (e.g., shown in FIG. 2B), respectively.

In some embodiments, to form the plurality of storage structures, a storage layer is formed along sidewalls of the opening, top and bottom surfaces of the recesses, and the sidewalls of the recesses over the stop structures, and part of the storage layer is removed. A storage layer (not shown) can be first formed along the sidewalls of opening 210, the top and bottom surfaces of recesses 220, and the sidewalls of recesses 220 over stop structures 216 using depositing a layer of silicon nitride using one or more thin film deposition processes, such as ALD, CVD, PVD, any other suitable processes, or any combination thereof through opening 210. Part of the storage layer along the sidewall of opening 210 can then be removed, leaving the remainder of storage the layer in recesses 220 to form storage structures 218 over stop structures 216, respectively. Since the storage layer can fully fill recesses 220, the remainder of the storage layer in recesses 220 after etching, i.e., each storage structure 218, can have nominally the same vertical dimension as a respective stop structure 216. In some embodiments, to remove the part of the storage layer, the storage layer is wet etched selective to dielectric layers 208. In some embodiments in which the storage layer includes silicon nitride and dielectric layers 208 include silicon oxide, a wet etchant including phosphoric acid is applied through opening 210 to etch the storage layer. The etching rate and/or etching time can also be controlled such that the part of the storage layer along the sidewalls of opening 210 is removed, leaving storage structures 218 in recesses 220 intact.

In some embodiments, instead of removing part of the storage layer directly to form storage structures 218 as described above, part of the storage layer is oxidized first, and then the oxidized part of the storage layer is removed. In some embodiments, oxidizing is performed by at least one of thermal oxidation or chemical oxidation. The thermal oxidation can include ISSG. The oxidation process can be performed in a controlled manner such that only part of the storage layer is oxidized, leaving the remainder of the storage layer intact. The thickness of the resulting native oxide (and the remainder of the storage layer) can be controlled by the thermal oxidation temperature and/or time. In some embodiments, the part of the storage layer is oxidized by a chemical oxidation process, for example, including ozone. In some embodiments, the wet chemical is a mixture of hydrofluoric acid and ozone (e.g., FOM). The thickness of the resulting native oxide can be controlled by the wet chemical compositions, temperature, and/or time.

In some embodiments, the oxidization process is controlled such that the remainder of the storage layer after oxidation includes two portions with different thicknesses (e.g., in the x-direction): storage structures 218 in recesses 220 and over stop structures 216, and protecting structures (not shown) outside of recesses 220 and facing dielectric layers 208. The thickness of storage structures 218 can be greater than that of the protecting structure due to recesses 220. The protecting structures can serve as the etch stop layer to protect dielectric layers 208 underneath in the later processes. The remainder of the storage layer after oxidation remains a continuous layer with non-uniform thicknesses, according to some embodiments In some embodiments, to remove the oxidized part of the storage layer, the oxidized part of the storage layer is wet etched selective to the remainder of the storage layer. In some embodiments, the storage layer includes silicon nitride, and an etchant used by the wet etching includes hydrofluoric acid. In some embodiments, the remainder of the storage layer includes storage structures 218 in recesses 220 and over stop structures 216, and the protecting structures (not shown) outside of recesses 220 and facing dielectric layers 208.

Method 400 proceeds to operation 410, as illustrated in FIG. 4, in which a tunneling layer and a semiconductor channel are sequentially formed over the storage structures. As illustrated in FIG. 2C, a tunneling layer 221 and a semiconductor channel 226 are sequentially formed over storage structures 218. In some embodiments, a layer of silicon oxide and a layer of polysilicon are sequentially deposited over storage structures 218 using one or more thin film deposition processes including, but not limited to, PVD, CVD, ALD, or any combination thereof. In some embodiments, the bottom of tunneling layer 221 is etched through before depositing polysilicon for semiconductor channel 226, such that a bottom portion of semiconductor channel 226 is in contact with single crystalline silicon plug 212. As illustrated in FIG. 2C, in some embodiments, a capping layer 222 is formed over semiconductor channel 226 to partially or fully fill opening 210 (e.g., in FIG. 2B) by depositing a layer of silicon oxide into opening 210 using one or more thin film deposition processes including, but not limited to, PVD, CVD, ALD, or any combination thereof. As illustrated in FIG. 2C, a channel plug 228 is formed above and in contact with semiconductor channel 226, for example, by etching back the top portions of semiconductor channel 226 and capping layer 222, and filling the etched back portions with a layer of polysilicon.

Figure 2D:
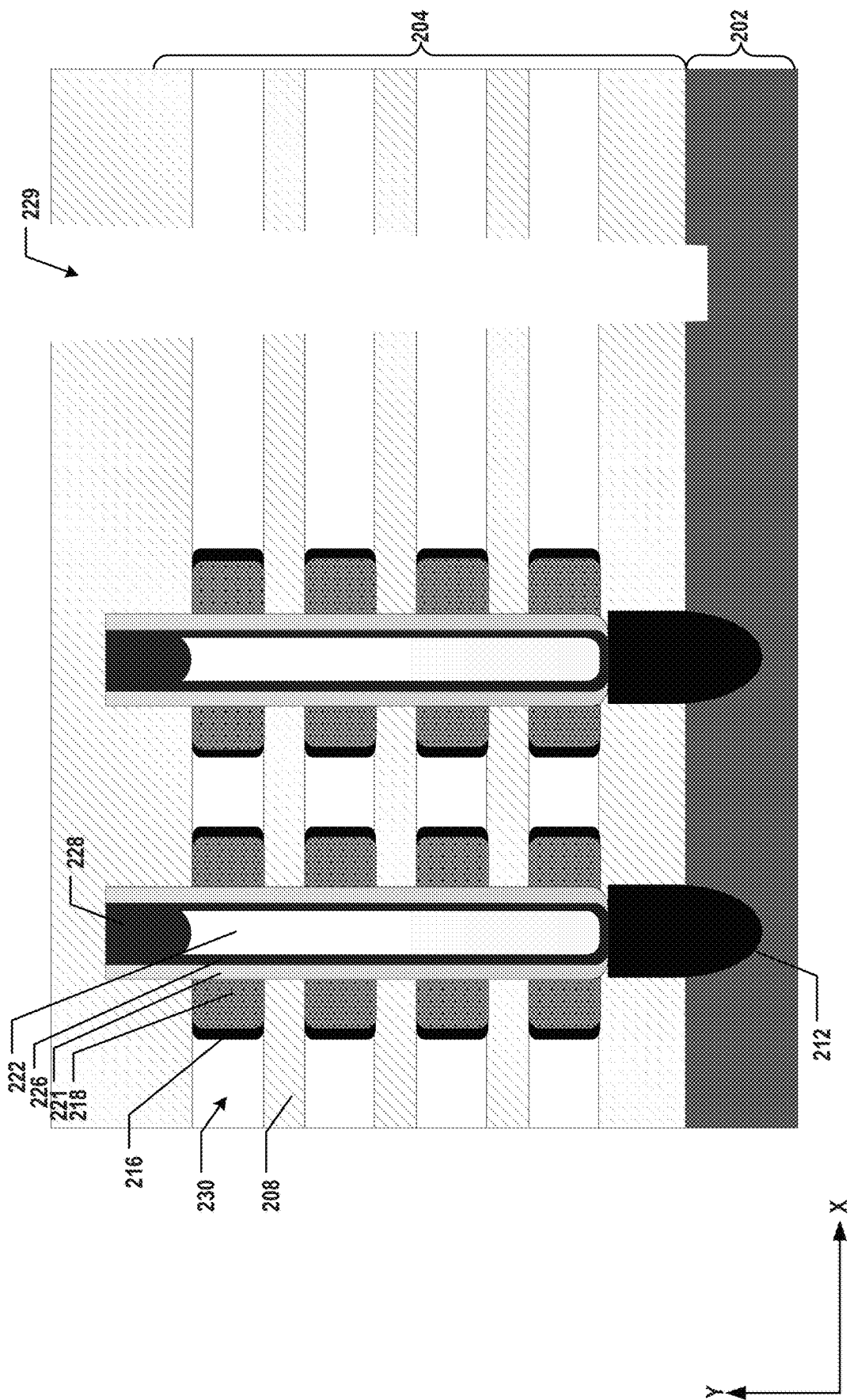

Method 400 proceeds to operation 412, as illustrated in FIG. 4, in which a second opening extending vertically through the dielectric stack is formed. As illustrated in FIG. 2D, a slit 229 is an opening formed that extends vertically through dielectric stack 204. In some embodiments, fabrication processes for forming slit 229 include wet etch and/or dry etch processes, such as DRIE. In some embodiments, dielectric layers 208 and sacrificial layers 206 (e.g., in FIG. 2C) of dielectric stack 204 are first etched. The etching of dielectric stack 204 may not stop at the top surface of silicon substrate 202 and extend further into silicon substrate 202. In some embodiments, a second etching process can be performed to etch part of silicon substrate 202, for example, by controlling the etch rate and/or etch time.

Method 400 proceeds to operation 414, as illustrated in FIG. 4, in which remainders of the plurality of sacrificial layers are removed, stopped at the plurality of stop structures, to form a plurality of second recesses. In some embodiments, to remove the remainders of the plurality of sacrificial layers, the remainders of the sacrificial layers are wet etched selective to the dielectric layers and the stop structures through the second opening.

As illustrated in FIG. 2D, sacrificial layers 206 (e.g., in FIG. 2C) are removed by, for example, wet etching, to form a plurality of recesses 230 vertically between dielectric layers 208. In some embodiments in which sacrificial layers 206 include silicon nitride and dielectric layers 208 include silicon oxide, etchants having phosphoric acid are applied through slit 229 to selectively etch silicon nitride of sacrificial layers 206 against silicon oxide of dielectric layers 208. The etching of sacrificial layers 206 can be stopped by stop structures 216 having materials different from that of sacrificial layers 206 (e.g., stop structures 216 having polysilicon or silicon oxide, and sacrificial layer 206 having silicon nitride). That is, the removal of the remainders of sacrificial layer 206 does not affect dielectric layers 208, stop structures 216, and other structures protected by stop structures 216 (e.g., storage structures 218), according to some embodiments.

Method 400 proceeds to operation 416, as illustrated in FIG. 4, in which the plurality of stop structures are removed to expose the plurality of storage structures. In some embodiments, to remove the plurality of stop structures, the stop structures are wet etched selective to the dielectric layers and the storage structures through the second opening and the second recesses.

Figure 2E:
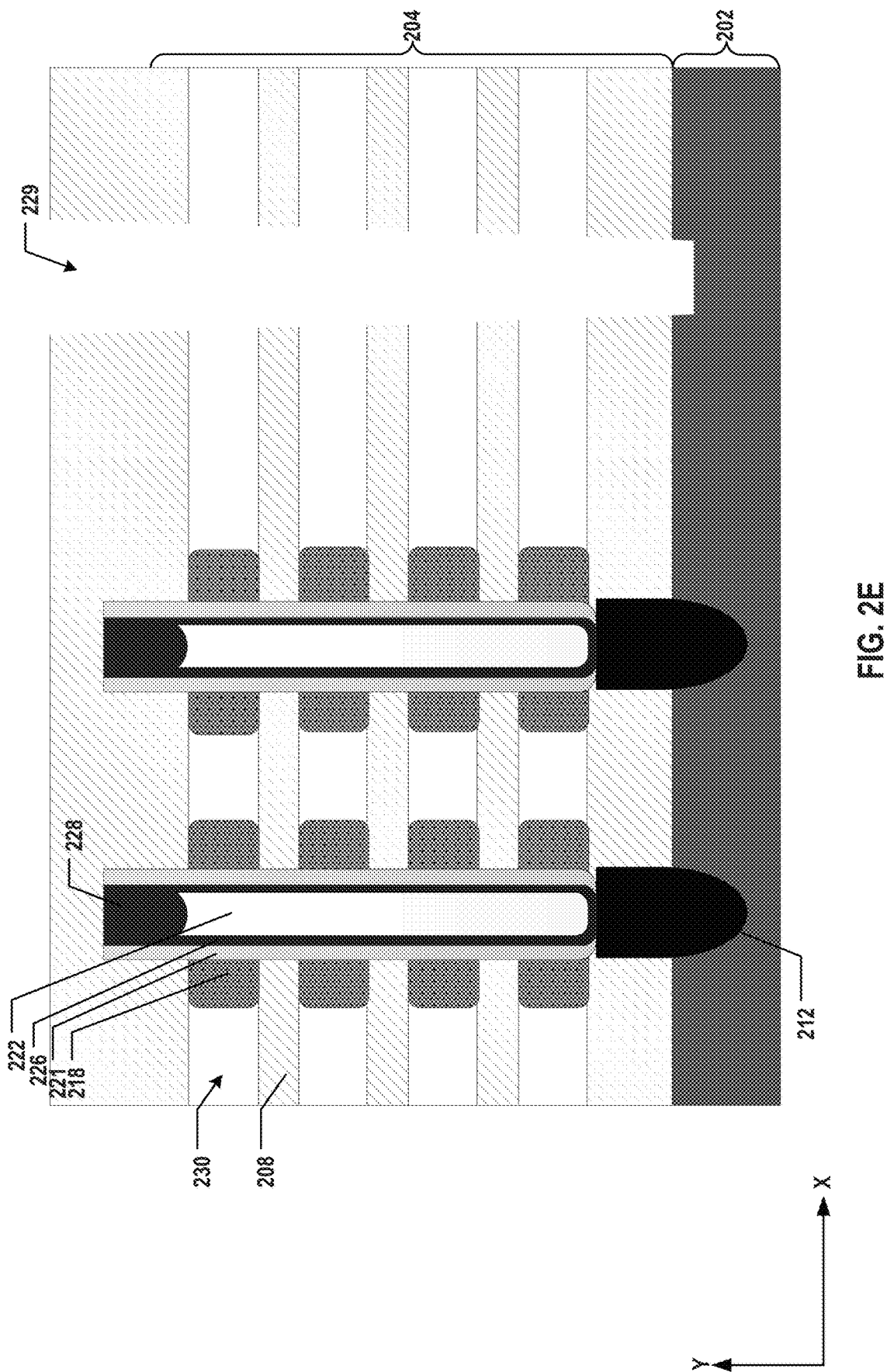

As illustrated in FIG. 2E, stop structures 216 (e.g., in FIG. 2D) are removed by, for example, wet etching, to expose storage structures 218 in recesses 230. In some embodiments in which stop structures 216 include polysilicon, etchants having tetramethylammonium hydroxide (TMAH) are applied through slit 229 and recesses 230 to selectively etch polysilicon of stop structures 216. The etching of stop structures 216 can be stopped by storage structures 218 having materials different from that of stop structures 216 (e.g., stop structures 216 having polysilicon or silicon oxide, and storage structures 218 having silicon nitride).

Method 400 proceeds to operation 418, as illustrated in FIG. 4, in which a plurality of blocking structures are formed over the plurality of storage structures in the plurality of second recesses. In some embodiments, to form the plurality of blocking structures, parts of the storage structures facing sidewalls of the second recesses are oxidized.

Figure 2F:
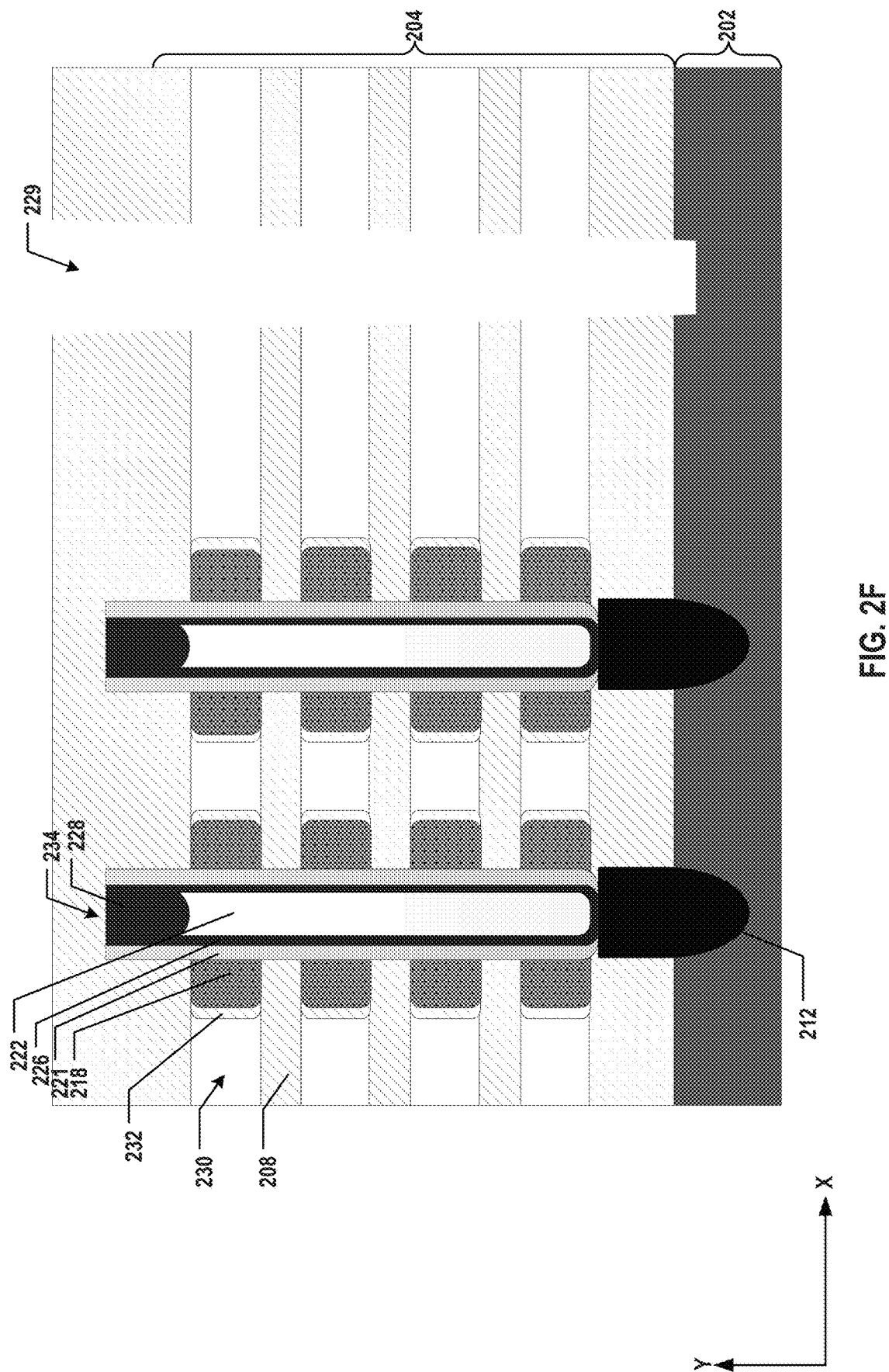

As illustrated in FIG. 2F, a respective part of each storage structure 218 facing the sidewall of a respective recess 230 is oxidized to form native oxide as a respective blocking structure 232. The oxidation process can be performed by a thermal oxidation process and or a chemical oxidation process. In some embodiments in which storage structure 218 includes silicon nitride, blocking structure 232 includes silicon oxide. It is understood that depending on the oxidization processes (e.g., the extent to which nitrogen atoms and ions are removed from the native oxide), blocking structure 232 can be entirely silicon oxide, entirely silicon oxynitride, and a mixture of silicon oxide and silicon oxynitride. In some embodiments, the part of storage structure 218 is oxidized by a thermal oxidation process. Either dry oxidation using molecular oxygen as the oxidant or wet oxidation using water vapor as the oxidant can be used to form blocking structure 232 at a temperature, for example, not greater than about 850° C. For example, the thermal oxidation may include an ISSG process, which uses oxygen gas and hydrogen gas to create water in the form of steam. A channel structure 234 including blocking structures 232, storage structures 218, tunneling layer 221, semiconductor channel 226, capping layer 222, single crystalline silicon plug 212, and channel plug 228 is thereby formed, according to some embodiments.

Figure 2G:
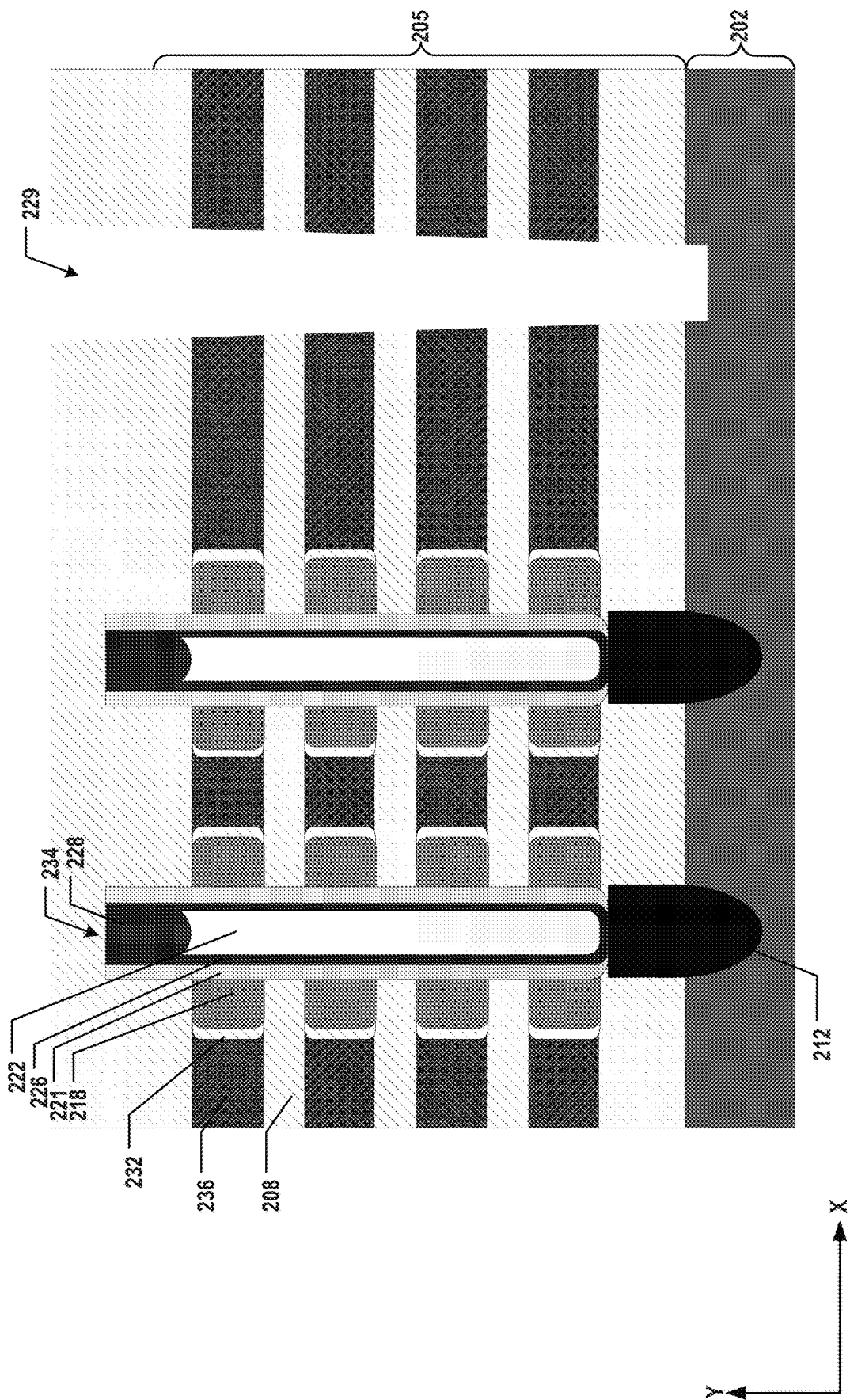

Method 400 proceeds to operation 420, as illustrated in FIG. 4, in which a plurality of conductive layers are formed in the second recesses, such that a vertical dimension of each of the storage structures is nominally the same as a vertical dimension of a respective one of the plurality of conductive layers. As illustrated in FIG. 2G, conductive layers 236 are form in recesses 230 (e.g., in FIG. 2F). The conductive materials of conductive layers 236, for example, a metal (e.g., W), can be deposited to fill recesses 230 using one or more thin film deposition processes, such as CVD, PVD, ALD, electroplating, electroless plating, or any combination thereof through the slit openings. The later formation of blocking structures 232 after the formation of storage structures 218 does not reduce the vertical dimension (the trap length $L_T$) of storage structure 218, according to some embodiments. As a result, the vertical dimension (the trap length $L_T$) of storage structure 218 can be nominally the same as the vertical dimension (the gate length $L_G$) of conductive layer 236, as well as the vertical dimension (the blocking length $L_B$) of blocking structure 232. A memory stack 205 including vertically interleaved conductive layers 236 and dielectric layers 208 is thereby formed, replacing dielectric stack 204 (e.g., in FIG. 2F), according to some embodiments.

Method 400 proceeds to operation 422, as illustrated in FIG. 4, in which a slit structure is formed in the second opening. The slit structure can be a source contact structure (e.g., in FIGS. 1A and 1B) or an insulating structure (not shown). The source contact structure can be formed by depositing one or more dielectric materials as the spacer, followed by depositing one or more conductive materials as the source contact into slit 229 using, one or more thin film deposition processes, such as PVD, CVD, ALD, or any combinations thereof. Similarly, the insulating structure can be formed by depositing one or more dielectric materials, such as high-k dielectrics and silicon oxide, into slit 229 to completely or partially fill slit 229 with or without air gap using one or more thin film deposition processes, such as PVD, CVD, ALD, or any combinations thereof.

Figure 5:
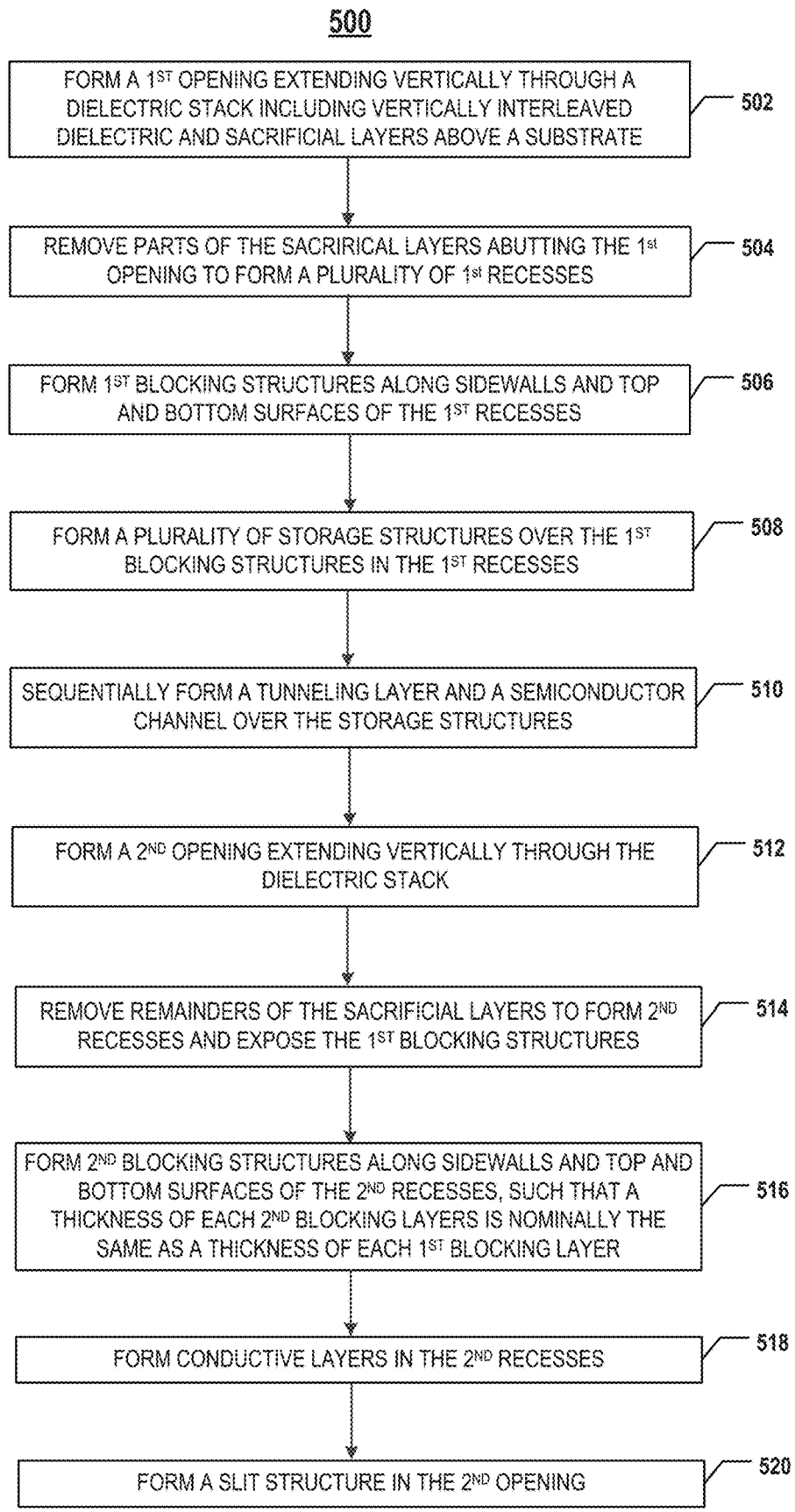
FIG. 5 illustrates a flowchart of another exemplary method for forming a 3D memory device, according to some embodiments of the present disclosure.

FIGS. 3A-3E illustrate another exemplary fabrication process for forming a 3D memory device, according to some embodiments of the present disclosure. FIG. 5 illustrates a flowchart of another exemplary method 500 for forming a 3D memory device, according to some embodiments of the present disclosure. Examples of the 3D memory device depicted in FIGS. 3A-3E and FIG. 5 includes 3D memory device 100 depicted in FIG. 1B. FIGS. 3A-3E and FIG. 5 will be described together. It is understood that the operations shown in method 500 are not exhaustive and that other operations can be performed as well before, after, or between any of the illustrated operations. Further, some of the operations may be performed simultaneously, or in a different order than shown in FIG. 5.

Referring to FIG. 5, method 500 starts at operation 502, in which a first opening extending vertically through a dielectric stack above a substrate is formed. The dielectric stack can include a plurality of vertically interleaved dielectric layers and sacrificial layers. The substrate can be a silicon substrate.

As illustrated in FIG. 3A, a dielectric stack 304 including vertically interleaved first dielectric layers 308 and second dielectric layers (referred to herein as "sacrificial layers" 306, together referred to herein as "dielectric layer pairs") are formed above a silicon substrate 302. In some embodiments, a pad layer (not shown) is formed between dielectric stack 304 and silicon substrate 302 by depositing dielectric materials, such as silicon oxide, or thermal oxidation, on silicon substrate 302 prior to the formation of dielectric stack 304. Dielectric layers 308 and sacrificial layers 306 can be alternatively deposited above silicon substrate 302 to form dielectric stack 304. In some embodiments, each dielectric layer 308 includes a layer of silicon oxide, and each sacrificial layer 306 includes a layer of silicon nitride. Dielectric stack 304 can be formed by one or more thin film deposition processes including, but not limited to, CVD, PVD, ALD, or any combination thereof.

As illustrated in FIG. 3A, an opening 310 is formed extending vertically through dielectric stack 304. In some embodiments, a plurality of openings 310 are formed through dielectric stack 304, such that each opening 310 becomes the location for growing an individual channel structure in the later process. In some embodiments, fabrication processes for forming opening 310 include wet etching and/or dry etching, such as DRIE. In some embodiments, opening 310 extends further through the top portion of silicon substrate 302. The etching process through dielectric stack 304 may not stop at the top surface of silicon substrate 302 and may continue to etch part of silicon substrate 302. In some embodiments, a separate etching process is used to etch part of silicon substrate 302 after etching through dielectric stack 304.

As illustrated in FIG. 3A, in some embodiments, a single crystalline silicon plug 312 is formed by selectively filling the lower portion of opening 310 with single crystalline silicon epitaxially grown from silicon substrate 302 in any suitable direction (e.g., from the bottom surface and/or side surface). The fabrication processes for growing single crystalline silicon plug 312 can include, but not limited to, VPE, LPE, MPE, or any combinations thereof.

Method 500 proceeds to operation 504, as illustrated in FIG. 5, in which parts of the sacrificial layers facing the opening are removed to form a plurality of first recesses. In some embodiments, to remove the parts of the sacrificial layers, the parts of the sacrificial layers are wet etched selective to the dielectric layers.

As shown in FIG. 3A, a plurality of recesses 320 are formed by removing parts of sacrificial layers 306 facing the sidewall of opening 310. Recesses 320 are formed laterally between sacrificial layers 306 and opening 310, according to some embodiments. Recesses 320 can be formed by etching back sacrificial layers 306 using wet etching selective to dielectric layers 308 through opening 310. In some embodiments in which sacrificial layers 306 include silicon nitride and dielectric layers 308 include silicon oxide, a wet etchant including phosphoric acid is applied through opening 310 to etch parts of sacrificial layers 306 facing opening 310 to form recesses 320. By controlling the etch rate and/or etch time, only parts of sacrificial layers 306 are etched with a desired lateral dimension, e.g., in the x-direction, according to some embodiments. It is understood that in some examples, the wet etching process for forming recesses 320 may be part of a cleaning process prior to forming single crystalline silicon plug 312. That is, single crystalline silicon plug 312 may be formed after the formation of recesses 320.

Method 500 proceeds to operation 506, as illustrated in FIG. 5, in which a plurality of first blocking structures are formed along sidewalls and top and bottom surfaces of the plurality of first recesses. As illustrated in FIG. 3B, first blocking structures 316 are formed along the sidewalls of the top and bottom surfaces of recesses 320 (e.g., in FIG. 3A). Although not shown, it is understood that in some examples, first blocking structures 316 may be formed along the sidewalls of opening 310 (e.g., in FIG. 3A) as well. In other words, first blocking structures 316 may be parts of a continuous blocking layer formed along the sidewalls of opening 310, the top and bottom surfaces of recesses 320, and the sidewalls of recesses 320. In some embodiments, a blocking layer is formed by depositing a layer of silicon nitride along the sidewalls of opening 310, the top and bottom surfaces of recesses 320, and the sidewalls of recesses 320 using one or more thin film deposition processes, such as ALD, CVD, PVD, any other suitable processes, or any combination, followed by oxidizing the layer of silicon nitride using thermal oxidation or chemical oxidation.

Method 500 proceeds to operation 508, as illustrated in FIG. 5, in which a plurality of storage structures are formed over the first blocking structures in the plurality of first recesses. As illustrated in FIG. 3B, storage structures 318 are formed over first blocking structures 316 in recesses 320 (e.g., shown in FIG. 3A), respectively.

In some embodiments, to form the plurality of storage structures, a storage layer is formed over the first blocking structures and along the sidewalls of the opening, and part of the storage layer is removed. A storage layer (not shown) can be first formed along the sidewalls of opening 310 and over first blocking structures 316 using depositing a layer of silicon nitride using one or more thin film deposition processes, such as ALD, CVD, PVD, any other suitable processes, or any combination thereof through opening 210. Part of the storage layer along the sidewall of opening 310 can then be removed, leaving the remainder of storage the layer in recesses 320 to form storage structures 318 over first blocking structures 316, respectively. In some embodiments, to remove the part of the storage layer, the storage layer is wet etched selective to dielectric layers 308. In some embodiments in which the storage layer includes silicon nitride and dielectric layers 308 include silicon oxide, a wet etchant including phosphoric acid is applied through opening 310 to etch the storage layer. The etching rate and/or etching time can also be controlled such that the part of the storage layer along the sidewalls of opening 310 is removed, leaving storage structures 318 in recesses 320 intact.

In some embodiments, instead of removing part of the storage layer directly to form storage structures 318 as described above, part of the storage layer is oxidized first, and then the oxidized part of the storage layer is removed. In some embodiments, oxidizing is performed by at least one of thermal oxidation or chemical oxidation. The thermal oxidation can include ISSG. The oxidation process can be performed in a controlled manner such that only part of the storage layer is oxidized, leaving the remainder of the storage layer intact. The thickness of the resulting native oxide (and the remainder of the storage layer) can be controlled by the thermal oxidation temperature and/or time. In some embodiments, the part of the storage layer is oxidized by a chemical oxidation process, for example, including ozone. In some embodiments, the wet chemical is a mixture of hydrofluoric acid and ozone (e.g., FOM). The thickness of the resulting native oxide can be controlled by the wet chemical compositions, temperature, and/or time.

In some embodiments, the oxidization process is controlled such that the remainder of the storage layer after oxidation includes two portions with different thicknesses (e.g., in the x-direction): storage structures 318 in recesses 320 and first blocking structures 316, and protecting structures (not shown) outside of recesses 320 and facing dielectric layers 308. The thickness of storage structures 318 can be greater than that of the protecting structure due to recesses 320. The protecting structures can serve as the etch stop layer to protect dielectric layers 308 underneath in the later processes. The remainder of the storage layer after oxidation remains a continuous layer with non-uniform thicknesses, according to some embodiments In some embodiments, to remove the oxidized part of the storage layer, the oxidized part of the storage layer is wet etched selective to the remainder of the storage layer. In some embodiments, the storage layer includes silicon nitride, and an etchant used by the wet etching includes hydrofluoric acid. In some embodiments, the remainder of the storage layer includes storage structures 318 in recesses 320 and over first blocking structures 316, and the protecting structures (not shown) outside of recesses 320 and facing dielectric layers 308.

Method 500 proceeds to operation 510, as illustrated in FIG. 5, in which a tunneling layer and a semiconductor channel are sequentially formed over the storage structures. As illustrated in FIG. 3B, a tunneling layer 321 and a semiconductor channel 326 are sequentially formed over storage structures 318. In some embodiments, a layer of silicon oxide and a layer of polysilicon are sequentially deposited over storage structures 318 using one or more thin film deposition processes including, but not limited to, PVD, CVD, ALD, or any combination thereof. In some embodiments, the bottom of tunneling layer 321 is etched through before depositing polysilicon for semiconductor channel 326, such that a bottom portion of semiconductor channel 326 is in contact with single crystalline silicon plug 312. As illustrated in FIG. 3B, in some embodiments, a capping layer 322 is formed over semiconductor channel 326 to partially or fully fill opening 310 (e.g., in FIG. 3A) by depositing a layer of silicon oxide into opening 310 using one or more thin film deposition processes including, but not limited to, PVD, CVD, ALD, or any combination thereof. As illustrated in FIG. 3B, a channel plug 328 is formed above and in contact with semiconductor channel 326, for example, by etching back the top portions of semiconductor channel 326 and capping layer 322, and filling the etched back portions with a layer of polysilicon.

Method 500 proceeds to operation 512, in which a second opening extending vertically through the dielectric stack is formed. As illustrated in FIG. 3C, a slit 329 is an opening formed that extends vertically through dielectric stack 304. In some embodiments, fabrication processes for forming slit 329 include wet etch and/or dry etch processes, such as DRIE. In some embodiments, dielectric layers 308 and sacrificial layers 306 (e.g., in FIG. 3B) of dielectric stack 304 are first etched. The etching of dielectric stack 304 may not stop at the top surface of silicon substrate 302 and extend further into silicon substrate 302. In some embodiments, a second etching process can be performed to etch part of silicon substrate 302, for example, by controlling the etch rate and/or etch time.

Method 500 proceeds to operation 514, as illustrated in FIG. 5, in which remainders of the plurality of sacrificial layers are removed to form a plurality of second recesses and expose the plurality of first blocking structures. In some embodiments, to remove the remainders of the plurality of sacrificial layers, the remainders of the sacrificial layers are wet etched selective to the dielectric layers and the first blocking structures through the second opening.

As illustrated in FIG. 3C, sacrificial layers 306 (e.g., in FIG. 3B) are removed by, for example, wet etching, to form a plurality of recesses 330 vertically between dielectric layers 308. In some embodiments in which sacrificial layers 306 include silicon nitride and dielectric layers 308 include silicon oxide, etchants having phosphoric acid are applied through slit 329 to selectively etch silicon nitride of sacrificial layers 306 against silicon oxide of dielectric layers 308. The etching of sacrificial layers 306 can be stopped by first blocking structures 316 having materials different from that of sacrificial layers 306 (e.g., first blocking structures 316 having silicon oxide, and sacrificial layer 306 having silicon nitride). That is, the removal of the remainders of sacrificial layer 306 does not affect dielectric layers 308, first blocking structures 316, and other structures protected by first blocking structures 316 (e.g., storage structures 318), according to some embodiments.

Method 500 proceeds to operation 516, as illustrated in FIG. 5, in which a plurality of second blocking structures are formed along sidewalls and top and bottom surfaces of the plurality of second recesses, such that a thickness of each of the plurality of second blocking structures is nominally the same as a thickness of each of the plurality of first blocking structures. In some embodiments, to form the plurality of second blocking structures, the second blocking structures are deposited over the first blocking structures and the dielectric layers in the second recesses, for example, using ALD. In some embodiments, the first blocking structures and the second blocking structures include the same material, such as silicon oxide. Each of the second blocking structures can be in contact with a respective one of the first blocking structures at the sidewall of a respective one of the second recesses to form a blocking structure.

As illustrated in FIG. 3D, second blocking structures 317 are formed along the sidewalls and top and bottom surfaces of recesses 330. The thickness of each second blocking structure 317 is nominally the same as the thickness of a respective first blocking structure 316. As a result, the vertical dimension of the remainder of recesses 330 can become nominally the same as the vertical dimension of storage structure 318. Second blocking structures 317 can be formed by depositing a layer of silicon oxide along the sidewalls and top and bottom surfaces of recesses 330 using one or more thin film deposition processes including, but not limited to, PVD, CVD, ALD, or any combination thereof through slit 329 and recesses 330. In some embodiments, second blocking structures 317 is deposited using ALD to precisely control the thickness of second blocking structures 317 to be nominally the same as the thickness of first blocking structures 316. In some embodiments, a layer of silicon nitride is first deposited and then oxidized to form second blocking structures 317 having silicon oxide.

First and second blocking structures 316 and 317 can have the same material (e.g., silicon oxide), nominally the same thickness, and be in contact with one another to form a blocking structure 319. It is understood that although first and second blocking structures 316 and 317 are formed in different fabrication processes, the interface and boundary between first and second blocking structures 316 and 317 may become indistinguishable and may not be discerned in blocking structure 319 in the final product after fabrication. It is also understood the interface and boundary between dielectric layers 308 and blocking structures 319 may become indistinguishable and may not be discerned as well in the final product after fabrication in the case the dielectric layers 308 and blocking structures 319 have the same material, such as silicon oxide. A channel structure 334 including blocking structures 319, storage structures 318, tunneling layer 321, semiconductor channel 326, capping layer 322, single crystalline silicon plug 312, and channel plug 328 is thereby formed, according to some embodiments.

Figure 3E:
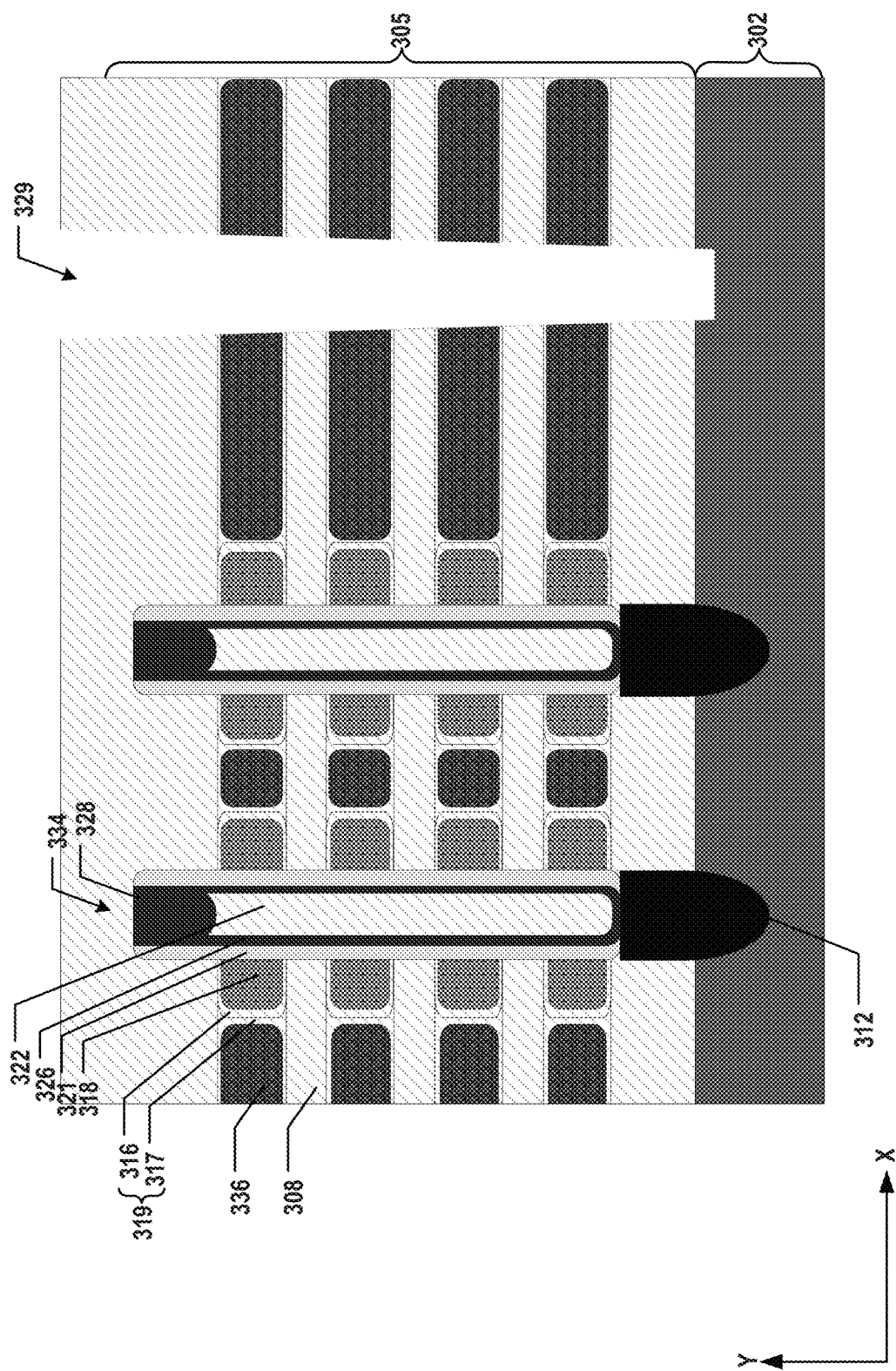

Method 500 proceeds to operation 518, as illustrated in FIG. 5, in which a plurality of conductive layers are formed in the second recesses, such that a vertical dimension of each of the storage structures is nominally the same as a vertical dimension of a respective one of the plurality of conductive layers. As illustrated in FIG. 3E, conductive layers 336 are form in recesses 330 (e.g., in FIG. 3D). The conductive materials of conductive layers 336, for example, a metal (e.g., W), can be deposited to fill recesses 330 using one or more thin film deposition processes, such as CVD, PVD, ALD, electroplating, electroless plating, or any combination thereof through the slit openings. The later formation of first and second blocking structures 316 and 317 with nominally the same thickness can cause the same degree of dimension reduction to storage structures 318 and conductive layers 336, respectively. As a result, although smaller than the vertical dimension (the blocking length $L_B$) of blocking structure 319, the vertical dimension (the trap length $L_T$) of storage structure 318 can still be nominally the same as the vertical dimension (the gate length $L_G$) of conductive layer 336. A memory stack 305 including vertically interleaved conductive layers 336 and dielectric layers 308 is thereby formed, replacing dielectric stack 304 (e.g., in FIG. 3D), according to some embodiments.

Method 500 proceeds to operation 520, as illustrated in FIG. 5, in which a slit structure is formed in the second opening. The slit structure can be a source contact structure (e.g., in FIGS. 1A and 1B) or an insulating structure (not shown). The source contact structure can be formed by depositing one or more dielectric materials as the spacer, followed by depositing one or more conductive materials as the source contact into slit 329 using one or more thin film deposition processes, such as PVD, CVD, ALD, or any combinations thereof. Similarly, the insulating structure can be formed by depositing one or more dielectric materials, such as high-k dielectrics and silicon oxide, into slit 329 to completely or partially fill slit 329 with or without air gap using one or more thin film deposition processes, such as PVD, CVD, ALD, or any combinations thereof.

According to one aspect of the present disclosure, a method for forming a 3D memory device is disclosed. A first opening extending vertically through a dielectric stack is formed above a substrate. The dielectric stack includes dielectric layers and sacrificial layers interleaving the dielectric layers. Parts of the sacrificial layers facing the opening are removed to form a plurality of first recesses. A plurality of stop structures are formed along sidewalls of the plurality of first recesses. A plurality of storage structures are formed over the plurality of stop structures in the plurality of first recesses. The plurality of sacrificial layers are removed to expose the plurality of stop structures from a plurality of second recesses opposing the plurality of first recesses. The plurality of stop structures are removed to expose the plurality of storage structures. A plurality of blocking structures are formed over the plurality of storage structures in the plurality of second recesses.

In some embodiments, to form the plurality of stop structures, epitaxial layers are grown from the sacrificial layers facing the sidewalls of the first recesses.

In some embodiments, to form the plurality of stop structures, parts of the sacrificial layers facing the sidewalls of the first recesses are oxidized.

In some embodiments, prior to removing the plurality of sacrificial layers, a tunneling layer and a semiconductor channel are sequentially formed over the storage structures in the first opening.

In some embodiments, prior to removing the plurality of sacrificial layers, a second opening extending vertically through the dielectric stack is formed. In some embodiments, to remove the plurality of sacrificial layers, the sacrificial layers are wet etched selective to the dielectric layers and the stop structures through the second opening.

In some embodiments, to remove the plurality of stop structures, the stop structures are wet etched selective to the dielectric layers and the storage structures through the second opening and the second recesses.

In some embodiments, after forming the plurality of blocking structures, a slit structure is formed in the second opening.

In some embodiments, to form the plurality of blocking structures, parts of the storage structures facing sidewalls of the second recesses are oxidized.

In some embodiments, after forming the plurality of blocking structures, a plurality of conductive layers are formed in the second recesses, such that a vertical dimension of each of the storage structures is nominally the same as a vertical dimension of a respective one of the plurality of conductive layers.

In some embodiments, the stop structures include polysilicon, the storage structures include silicon nitride, and the blocking structures include silicon oxide.

According to another aspect of the present disclosure, a method for forming a 3D memory device is disclosed. A first opening extending vertically through a dielectric stack is formed above a substrate. The dielectric stack includes dielectric layers and sacrificial layers interleaving the dielectric layers. Parts of the sacrificial layers facing the opening are removed to form a plurality of first recesses. A plurality of first blocking structures are formed along sidewalls and top and bottom surfaces of the plurality of first recesses. A plurality of storage structures are formed over the plurality of first blocking structures in the plurality of first recesses. The plurality of sacrificial layers are removed to form a plurality of second recesses and expose the plurality of first blocking structures. A plurality of second blocking structures are formed along sidewalls and top and bottom surfaces of the plurality of second recesses, such that a thickness of each of the plurality of second blocking structures is nominally the same as a thickness of each of the plurality of first blocking structures.

In some embodiments, the first blocking structures and the second blocking structures comprise a same material.

In some embodiments, each of the second blocking structures is in contact with a respective one of the first blocking structures at the sidewall of a respective one of the second recesses to form a blocking structure.

In some embodiments, prior to removing the remainders of the plurality of sacrificial layers, a tunneling layer and a semiconductor channel are sequentially formed over the storage structures in the first opening.

In some embodiments, prior to removing the plurality of sacrificial layers, a second opening extending vertically through the dielectric stack is formed. In some embodiments, to remove the plurality of sacrificial layers, the sacrificial layers are wet etched selective to the dielectric layers and the first blocking structures through the second opening.

In some embodiments, to form the plurality of second blocking structures, the second blocking structures are deposited over the first blocking structures and the dielectric layers in the second recesses through the second opening and the second recesses.

In some embodiments, depositing the second blocking structures includes ALD.

In some embodiments, after forming the plurality of second blocking structures, a slit structure is formed in the second opening.

In some embodiments, after forming the plurality of second blocking structures, a plurality of conductive layers are formed in the second recesses, such that a vertical dimension of each of the storage structures is nominally the same as a vertical dimension of a respective one of the conductive layers.

In some embodiments, the first and second blocking structures include silicon oxide, and the storage structures include silicon nitride.

According to still another aspect of the present disclosure, a 3D memory device includes a memory stack including a plurality of vertically interleaved conductive layers and dielectric layers, and a channel structure extending through the memory stack along a vertical direction. The channel structure has a plurality of protruding portions protruding along a lateral direction and facing the conductive layers, respectively, and a plurality of normal portions facing the dielectric layers, respectively, without protruding along the lateral direction. The channel structure includes a plurality of blocking structures in the protruding portions, respectively. A vertical dimension of each of the conductive layers is nominally the same as a vertical dimension of a respective one of the storage structures.

In some embodiments, the channel structure further includes a plurality of blocking structures in the protruding portions, respectively. In some embodiments, at least part of each of the blocking structures is between a respective one of the storage structures and a respective one of the conductive layers along the lateral direction.

In some embodiments, part of each of the blocking structures is between the respective storage structure and a respective pair of the dielectric layers along the vertical direction.

In some embodiments, the vertical dimension of each of the storage structures is smaller than a vertical dimension of the at least part of the respective blocking structure.

In some embodiments, the blocking structures include silicon oxide, and the storage structures include silicon nitride.

In some embodiments, the channel structure further includes a tunneling layer over the storage structures, and a semiconductor channel over the tunneling layer.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments but should be defined only in accordance with the following claims and their equivalents.

What is claimed is:

1. A method for forming a three-dimensional (3D) memory device, comprising:
    forming a first opening extending vertically through a dielectric stack above a substrate, the dielectric stack comprising dielectric layers and sacrificial layers interleaving the dielectric layers;
    removing parts of the sacrificial layers facing the opening to form a plurality of first recesses;
    forming a plurality of stop structures along sidewalls of the plurality of first recesses;
    forming a plurality of storage structures over the plurality of stop structures in the plurality of first recesses;
    removing the plurality of sacrificial layers to expose the plurality of stop structures from a plurality of second recesses opposing the plurality of first recesses;
    removing the plurality of stop structures to expose the plurality of storage structures;
    forming a plurality of blocking structures over the plurality of storage structures in the plurality of second recesses; and
    forming a plurality of conductive layers over the plurality of blocking structures in the plurality of second recesses, a vertical dimension of one of the storage structures is nominally identical to a vertical dimension of a corresponding one of the conductive layers.

2. The method of claim 1, wherein forming the plurality of stop structures comprises growing epitaxial layers from the sacrificial layers facing the sidewalls of the first recesses.

3. The method of claim 1, wherein forming the plurality of stop structures comprises oxidizing parts of the sacrificial layers facing the sidewalls of the first recesses.

4. The method of claim 1, further comprising prior to removing the plurality of sacrificial layers, sequentially forming a tunneling layer and a semiconductor channel over the storage structures in the first opening.

5. The method of claim 1, further comprising prior to removing the plurality of sacrificial layers, forming a second opening extending vertically through the dielectric stack, wherein removing the plurality of sacrificial layers comprises wet etching, through the second opening, the sacrificial layers selective to the dielectric layers and the stop structures.

6. The method of claim 5, wherein removing the plurality of stop structures comprises wet etching, through the second opening and the second recesses, the stop structures selective to the dielectric layers and the storage structures.

7. The method of claim 5, further comprising after forming the plurality of blocking structures, forming a slit structure in the second opening.

8. The method of claim 1, wherein forming the plurality of blocking structures comprises oxidizing parts of the storage structures facing sidewalls of the second recesses.

9. The method of claim 1, wherein a vertical dimension of each of the storage structures is nominally the same as a vertical dimension of a respective one of the plurality of conductive layers.

10. The method of claim 1, wherein the stop structures comprise polysilicon, the storage structures comprise silicon nitride, and the blocking structures comprise silicon oxide.

11. A method for forming a three-dimensional (3D) memory device, comprising:
- forming a first opening extending vertically through a dielectric stack above a substrate, the dielectric stack comprising dielectric layers and sacrificial layers interleaving the dielectric layers;
- removing parts of the sacrificial layers facing the opening to form a plurality of first recesses;
- forming a plurality of first blocking structures along sidewalls and top and bottom surfaces of the plurality of first recesses;
- forming a plurality of storage structures over the plurality of first blocking structures in the plurality of first recesses;
- removing the plurality of sacrificial layers to form a plurality of second recesses and expose the plurality of first blocking structures; and
- forming a plurality of second blocking structures along sidewalls and top and bottom surfaces of the plurality of second recesses, wherein a thickness of each of the plurality of second blocking structures is nominally the same as a thickness of each of the plurality of first blocking structures.

12. The method of claim 11, wherein the first blocking structures and the second blocking structures comprise a same material.

13. The method of claim 12, wherein each of the second blocking structures is in contact with a respective one of the first blocking structures at the sidewall of a respective one of the second recesses to form a blocking structure.

14. The method of claim 11, further comprising prior to removing the plurality of sacrificial layers, sequentially forming a tunneling layer and a semiconductor channel over the storage structures in the first opening.

15. The method of claim 11, further comprising prior to removing the remainders of the plurality of sacrificial layers, forming a second opening extending vertically through the dielectric stack, wherein removing the plurality of sacrificial layers comprises wet etching, through the second opening, the sacrificial layers selective to the dielectric layers and the first blocking structures.

16. The method of claim 15, wherein forming the plurality of second blocking structures comprises depositing, through the second opening and the second recesses, the second blocking structures over the first blocking structures and the dielectric layers in the second recesses.

17. The method of claim 16, wherein depositing the second blocking structures comprises atomic layer deposition (ALD).

18. The method of claim 15, further comprising after forming the plurality of second blocking structures, forming a slit structure in the second opening.

19. The method of claim 11, further comprising after forming the plurality of second blocking structures, forming a plurality of conductive layers in the second recesses, wherein such that a vertical dimension of each of the storage structures is nominally the same as a vertical dimension of a respective one of the conductive layers.

20. The method of claim 11, wherein the first and second blocking structures comprise silicon oxide, and the storage structures comprise silicon nitride.

* * * * *